US008187486B1

(12) United States Patent
Liu et al.

(10) Patent No.: US 8,187,486 B1
(45) Date of Patent: May 29, 2012

(54) MODULATING ETCH SELECTIVITY AND ETCH RATE OF SILICON NITRIDE THIN FILMS

(75) Inventors: Xinye Liu, Sunnyvale, CA (US); Chiukin Steven Lai, Sunnyvale, CA (US)

(73) Assignee: Novellus Systems, Inc., San Jose, CA (US)

( * ) Notice: Subject to any disclaimer, the term of this patent is extended or adjusted under 35 U.S.C. 154(b) by 1152 days.

(21) Appl. No.: 12/002,085

(22) Filed: Dec. 13, 2007

(51) Int. Cl.
*B44C 1/22* (2006.01)
*C03C 15/00* (2006.01)
*C03C 25/68* (2006.01)
*C23F 1/00* (2006.01)
*C23F 3/00* (2006.01)

(52) U.S. Cl. ............. 216/79; 216/76; 438/706; 438/723

(58) Field of Classification Search .................. 438/756, 438/706, 723; 216/73, 76, 79
See application file for complete search history.

(56) References Cited

U.S. PATENT DOCUMENTS

| 4,313,782 A | 2/1982 | Sokoloski |
| 4,414,069 A | 11/1983 | Cuomo |
| 4,695,327 A | 9/1987 | Grebinski |
| 4,756,794 A | 7/1988 | Yoder |
| 5,030,319 A | 7/1991 | Nishino et al. |
| 5,268,069 A | 12/1993 | Chapple-Sokol et al. |
| 5,282,925 A * | 2/1994 | Jeng et al. ........................ 216/59 |
| 5,474,641 A | 12/1995 | Otsuki et al. |
| 5,505,816 A | 4/1996 | Barnes et al. |
| 5,636,320 A | 6/1997 | Yu et al. |
| 5,766,971 A | 6/1998 | Ahlgren et al. |
| 5,792,275 A | 8/1998 | Natzle et al. |
| 5,838,055 A | 11/1998 | Kleinhenz et al. |
| 5,858,830 A | 1/1999 | Yoo et al. |
| 5,876,879 A | 3/1999 | Kleinhenz et al. |
| 5,913,140 A | 6/1999 | Roche et al. |
| 5,968,279 A | 10/1999 | Macleish et al. |
| 5,976,973 A | 11/1999 | Ohira et al. |
| 5,990,019 A | 11/1999 | Torek et al. |
| 5,994,240 A | 11/1999 | Thakur |
| 6,030,881 A | 2/2000 | Papasouliotis et al. |
| 6,069,092 A | 5/2000 | Imai et al. |
| 6,071,815 A | 6/2000 | Kleinhenz et al. |
| 6,074,951 A | 6/2000 | Kleinhenz et al. |

(Continued)

FOREIGN PATENT DOCUMENTS

JP            74041461 B    * 11/1974

(Continued)

OTHER PUBLICATIONS

Liu et al., "Adsorption Based Material Removal Process," Novellus Systems, Inc., U.S. Appl. No. 11/479,812, filed Jun. 30, 2006.

(Continued)

*Primary Examiner* — Roberts Culbert
(74) *Attorney, Agent, or Firm* — Weaver Austin Villeneuve & Sampson LLP

(57) ABSTRACT

Etching of nitride and oxide layers with reactant gases is modulated by etching in different process regimes. High etch selectivity to silicon nitride is achieved in an adsorption regime where the partial pressure of the etchant is lower than its vapor pressure. Low etch selectivity to silicon nitride is achieved in a condensation regime where the partial pressure of the etchant is higher than its vapor pressure. By controlling partial pressure of the etchant, very high etch selectivity to silicon nitride may be achieved.

26 Claims, 10 Drawing Sheets

U.S. PATENT DOCUMENTS

| | | | |
|---|---|---|---|
| 6,146,970 | A | 11/2000 | Witek et al. |
| 6,204,198 | B1 | 3/2001 | Banerjee et al. |
| 6,265,302 | B1 | 7/2001 | Lim et al. |
| 6,335,261 | B1 | 1/2002 | Natzle et al. |
| 6,573,181 | B1 | 6/2003 | Srinivas et al. |
| 6,652,713 | B2 | 11/2003 | Brown et al. |
| 6,693,050 | B1 | 2/2004 | Cui et al. |
| 6,706,334 | B1 | 3/2004 | Kobayashi et al. |
| 6,716,691 | B1 * | 4/2004 | Evans et al. .......... 438/218 |
| 6,726,805 | B2 | 4/2004 | Brown et al. |
| 6,774,000 | B2 | 8/2004 | Natzle et al. |
| 6,776,874 | B2 | 8/2004 | Kobayashi et al. |
| 6,790,733 | B1 | 9/2004 | Natzle et al. |
| 6,803,309 | B2 | 10/2004 | Chou et al. |
| 6,817,776 | B2 | 11/2004 | Colgan et al. |
| 6,837,968 | B2 | 1/2005 | Brown et al. |
| 6,852,584 | B1 | 2/2005 | Chen et al. |
| 6,858,532 | B2 | 2/2005 | Natzle et al. |
| 6,905,965 | B2 | 6/2005 | Subrahmanyan et al. |
| 6,926,843 | B2 | 8/2005 | Cantell et al. |
| 6,949,481 | B1 | 9/2005 | Hallijal et al. |
| 6,951,821 | B2 | 10/2005 | Hamelin et al. |
| 6,967,167 | B2 | 11/2005 | Geiss et al. |
| 6,992,011 | B2 | 1/2006 | Nemoto et al. |
| 7,029,536 | B2 | 4/2006 | Hamelin et al. |
| 7,033,909 | B2 | 4/2006 | Kim et al. |
| 7,079,760 | B2 | 7/2006 | Hamelin et al. |
| 7,163,899 | B1 | 1/2007 | Cho et al. |
| 7,416,989 | B1 | 8/2008 | Liu et al. |
| 7,435,661 | B2 | 10/2008 | Miller et al. |
| 7,651,922 | B2 | 1/2010 | Matsuda |
| 7,977,249 | B1 | 7/2011 | Liu et al. |
| 7,981,763 | B1 | 7/2011 | Van Schravendijk et al. |
| 2001/0016226 | A1 | 8/2001 | Natzle et al. |
| 2002/0106908 | A1 | 8/2002 | Cohen et al. |
| 2003/0029568 | A1 | 2/2003 | Brown et al. |
| 2003/0134038 | A1 | 7/2003 | Paranjpe |
| 2004/0018740 | A1 | 1/2004 | Brown et al. |
| 2004/0083977 | A1 | 5/2004 | Brown et al. |
| 2004/0110354 | A1 | 6/2004 | Natzle et al. |
| 2004/0182324 | A1 | 9/2004 | Wallace et al. |
| 2004/0184792 | A1 | 9/2004 | Hamelin et al. |
| 2004/0185670 | A1 | 9/2004 | Hamelin et al. |
| 2004/0200244 | A1 | 10/2004 | Hung et al. |
| 2004/0212035 | A1 | 10/2004 | Yeo et al. |
| 2005/0056370 | A1 | 3/2005 | Brown et al. |
| 2005/0101130 | A1 | 5/2005 | Lopatin et al. |
| 2005/0106877 | A1 | 5/2005 | Elers et al. |
| 2005/0116300 | A1 | 6/2005 | Hieda et al. |
| 2005/0153519 | A1 | 7/2005 | Lu et al. |
| 2005/0205110 | A1 | 9/2005 | Kao et al. |
| 2005/0218113 | A1 | 10/2005 | Yue |
| 2005/0218507 | A1 | 10/2005 | Kao et al. |
| 2005/0221552 | A1 | 10/2005 | Kao et al. |
| 2005/0230350 | A1 | 10/2005 | Kao et al. |
| 2005/0266684 | A1 | 12/2005 | Lee et al. |
| 2005/0270895 | A1 | 12/2005 | Strang |
| 2006/0003596 | A1 | 1/2006 | Fucsko et al. |
| 2006/0051966 | A1 | 3/2006 | Or et al. |
| 2006/0115937 | A1 | 6/2006 | Barnett et al. |
| 2007/0063277 | A1 | 3/2007 | Belyansky et al. |
| 2007/0215975 | A1 | 9/2007 | Idani et al. |
| 2008/0233709 | A1 * | 9/2008 | Conti et al. .......... 438/424 |

FOREIGN PATENT DOCUMENTS

WO    WO 04/001809     12/2003

OTHER PUBLICATIONS

U.S. Office Action mailed Dec. 5, 2007 from U.S. Appl. No. 11/479,812.

U.S. Office Action mailed Jul. 17, 2007 from U.S. Appl. No. 11/479,812.

U.S. Office Action mailed May 2, 2007 from U.S. Appl. No. 11/479,812.

Schravendijk et al., "Protective Layer to Enable Damage Free Gap Fill," Novellus Systems, Inc., U.S. Appl. No. 12/002,171, filed Dec. 14, 2007.

Schravendijk et al., "Protective Layer to Enable Damage Free Gap Fill," Novellus Systems, Inc., U.S. Appl. No. 60/625,555, filed Apr. 18, 2007.

Liu et al., "Methods for Etching High Aspect Ratio Structures," Novellus Systems, Inc., U.S. Appl. No. 60/962,638, filed Jul. 30, 2007.

Liu et al., "Methods for Removing Silicon Nitride and Other Materials During Fabrication of Contacts and Interconnects," Novellus Systems, Inc., U.S. Appl. No. 60/905,782, filed Mar. 7, 2007.

Liu et al., "Methods of Removing Silicon Nitride and Other Materials During Fabrication of Contacts", Novellus Systems, Inc., U.S. Appl. No. 12/074,912, filed Mar. 7, 2009.

U.S. Office Action mailed Jan. 29, 2010 for U.S. Appl. No. 12/144,518.

Van Schravendijk et al., "Atomic layer removal for high aspect ratio gapfill", U.S. Appl. No. 12/341,943, filed Dec. 22, 2008.

U.S. Appl. No. 12/174,402, "Adsorption based material removal process", Liu et al., filed Jul. 16, 2008.

U.S. Appl. No. 12/244,241, "Gap fill using pulsed deposition layer and atomic layer removal", Drewery et al., filed Oct. 2, 2008.

U.S. Appl. No. 12/144,518, "Gap fill using pulsed deposition layer and atomic layer removal", Drewery et al., filed Jun. 23, 2008.

U.S. Office Action mailed Jun. 14, 2010 for U.S. Appl. No. 12/144,518.

U.S. Office Action mailed Jun. 11, 2010 for U.S. Appl. No 12/341,943.

U.S. Final Office Action for U.S. Appl. No. 12/341,943 mailed Dec. 23, 2010.

T. Meguro et al. "Digital etching of GaAs: New approach of dry etching to atomic ordered processing", Apr. 16, 1990, American Institute of Physics pp. 1552-1554.

S.D. Park et al. "Atomic Layer Etching of Si(100) and Si(111) Using $Cl_2$ and Ar Neutral Beam", Electrochemical and Solid-State Letters, 8 (8) C106-C109 (2005).

H. Ogawa et al., "Dry Cleaning Technology for Removal of Silicon Native Oxide Employing Hot $NH_3/NF_3$ Exposure", The Japan Society of Applied Physics, Part I, No. 8, Aug. 2002, pp. 5349-5358.

H. Nishino et al., "Damage-free selective etching of Si native oxides using $NH_3/NF_3$ and $SF_6/H_2O$ down-flow etching", J. Appl. Phys. vol. 74, No. 2, Jul. 15, 1993, pp. 1345-1348.

Y.Wang et al. "Ultrahigh-selectivity silicon nitride etch process using an inductively coupled plasma source", J. Vac. Sci. Technol. A, vol. 16, No. 3, May/Jun. 1998, pp. 1582-1587.

Phan et al., Integrated Clean Process Using $NF_3/NH_3$ Remote Plasma for Nickle Silicide Formation, SEMICON Korea STS 2006, pp. 159-163.

S. Athavale et al., Molecular dynamics simulation of atomic layer etching of silicon, J. Vac. ASci. Technol. A, vol. 13, No. 3, May/Jun. 1995, pp. 966-971.

W. Natzle et al., Trimming of hard-masks by Gaseous Chemical Oxide Removal (COR) for Sub-10nm Gates/Fins, for Gate Length Control and for Manufacturing Conference, pp. 61-65, 2004, IEEE.

Honda et al., "Chemical Dry Cleaning Technology for Reliable 65nm CMOS contact to $NiSi_x$", IITC-2005 paper9.4.

Okamura et al., "Low Damage Via Formation with Low Resistance by NH3 Thermal Reduction for Cu / Ultra Low-k Interconnects", 2004 IEEE, pp. 42-44.

Kim, et al., "New Contact Cleaning in HF & N2/H2 Microwave Plasma", Solid State Phenomena vol. 92, (2003), pp. 239-242.

Byun et al., The Effects of Reactive Precleaning (RPC+) on the Formation of Titanium Silicide by PECVD $TiCl_4$-Ti Deposition, and Its Thermal Stability, 2001, IEEE, pp. 222-224.

Taguwa, et al., "ICP-Ar/$H_2$ Precleaning and Plasma Damage-Free Ti-PECVD for Sub-Quarter Micron Contact of Logic with Embedded DRAM", Conference Proceedings USLI XV 2000, pp. 589-593.

Chang, et al., "Interface Characteristics of Selective Tungsten on Silicon Using a New Pretreatment Technology for ULSI Application", 1997 IEEE, pp. 738-743.

Park et al., "Low Damage In Situ Contact Cleaning Method by a Highly Dense and Directional ECR Plasma," Jpn J. Appl. Phys. vol. 35 (1996), pp. 1097-1101.

U.S. Appl. No. 11/479,812, Notice of Allowance mailed Jul. 1, 2008.

U.S. Appl. No. 11/479,812, Office Action mailed May 7, 2008.

Office Action for U.S. Appl. No. 12/244,241 mailed Feb. 3, 2011.
Office Action for U.S. Appl. No. 12/174,402 mailed Feb. 15, 2011.
U.S. Appl. No. 12/341,943, Notice of Allowance mailed Mar. 15, 2011.
U.S. Appl. No. 12/343,102, "Atomic layer removal process with higher etch amount", Draeger et al., filed Dec. 23, 2008.
Office Action for U.S. Appl. No. 12/343,102, mailed Apr. 21, 2011.
U.S. Notice of Allowance for U.S. Appl. No. 12/074,912, mailed Mar. 7, 2011 and Allowed Claims.
U.S. Office Action for U.S. Appl. No. 12/002,171, mailed Jun. 9, 2011.
U.S. Notice of Allowance for U.S. Appl. No. 12/174,402 mailed Jul. 13, 2011 and Allowed Claims.
U.S. Notice of Allowance for U.S. Appl. No. 12/343,102 mailed Sep. 14, 2011 and Allowed Claims.
Final Office Action for U.S. Appl. No. 12/002,171, mailed Nov. 17, 2011.

* cited by examiner

MODULATING ETCH SELECTIVITY AND ETCH RATE OF SILICON NITRIDE THIN FILMS

FIELD OF THE INVENTION

The present invention pertains to methods and apparatus of removing layers of material on a substrate. Particularly, the present invention pertains to selective removal of oxide and nitride layers from a partially fabricated integrated circuit. As examples, the methods can be applied for gap fill (e.g., shallow trench isolation (STI), pre-metal dielectric (PMD, intermetal dielectric (IMD), interlayer dielectric (ILD)), pre-silicide cleaning operations, and contact precleaning.

BACKGROUND OF THE INVENTION

Semiconductor processing often involves etching the workpiece, e.g., wafer, substrate, or flat panel, for a specified thickness. The material to be removed may not be the only film on the surface of the substrate. For example, a substrate surface may include both nitride and oxide layers in different areas. A nitride may be silicon nitride, silicon oxynitride, germanium nitride, among others. An oxide may be silicon oxide, hafnium oxide, zirconium oxide, titanium oxide, or germanium oxide, among others. In a feature such as a trench having a bottom and sidewalls, nitride film may line the sidewalls and the bottom. An oxide film may be deposited onto the nitride film. A feature may have a high aspect-ratio, where the opening across the top is small relative to the depth of the feature, or a low aspect-ratio, where the opening across the top is large relative to the depth of the feature. When more than one film is present on the surface of the substrate, etching one film generally involves etching the other; however, etching of the other film may be desirable in some circumstances and not desirable in other circumstances. Controlling relative etch rates of one material to another, i.e., modulating etch selectivities, allows selective etch of one film relative to others in some circumstances and etching of all films on the surface in other circumstances.

In some cases, the top layer of a substrate surface may consist of only one kind of film, but at different thicknesses. For example, an oxide film may line the sidewalls and bottom of a trench as well as cover the top surface outside of the trench. The oxide film may be thicker at the top surface and trench bottom while thinner at the sidewalls. In this case, conformal etching may remove the oxide completely in some areas (e.g., the sidewalls) while leaving some behind in other areas (e.g., the top surface and trench bottom). Where the oxide is completely removed, the underlying film becomes exposed to the etching process and may be etched also. In some circumstances, etching of the underlying film is undesirable. Such undesired etching may be limited by modulating etch selectivities.

"Selectivity" or "etch selectivity" is defined as the ratio of etch rate of one material, the reference material, relative to another material, the material of interest. In a preferred embodiment, the reference material is silicon oxide ($SiO_2$) and the material of interest is silicon nitride ($Si_3N_4$). In particular, the silicon nitride may be made by low pressure chemical vapor deposition (LPCVD). In another embodiment, the reference material is thermally-grown silicon oxide (t-$SiO_2$) and the material of interest is another silicon oxide, e.g., high density plasma chemical vapor deposition (HD-PCVD) deposited $SiO_2$. A precise way to refer to silicon nitride etch selectivity may be "etch selectivity of $SiO_2$ over $Si_3N_4$" or "etch selectivity of $SiO_2$ to $Si_3N_4$", instead of "etch selectivity of $Si_3N_4$". The $SiO_2$ in these phrases is the reference material to which the etch rate of the selected material (i.e., the material of interest) is compared. In the preferred embodiment, the phrases "etch selectivity of $Si_3N_4$", "etch selectivity to $Si_3N_4$" or "silicon nitride etch selectivity," without more, imply that the reference material is thermal silicon oxide. However, the etch selectivity need not always be defined relative to silicon oxide as the reference material. For example, a different reference material may be used explicitly, e.g., etch selectivity of zirconium oxide over LPCVD silicon nitride. An increase in etch selectivity means that the selected material, or material of interest, is harder to etch. A decrease in etch selectivity means that the selected material is easier to etch.

Besides selectivity, the absolute etch rate also may be important. Semiconductor processing involves hundreds of steps and many of them are etch processes. In certain circumstances, it may be desirable to have a very low or a very high etch rate. However, a very low etch rate may not be practical even if technically feasible, because the throughput may be negatively impacted. Thus for each semiconductor processing step, the etch selectivities and absolute etch rates are balanced against each other to maximize throughput while keeping undesired etching to a minimum.

SUMMARY

The invention may be used in processes for manufacturing integrated circuits such as in interconnect and contact pre-clean applications, gate dielectric processing, and gap fill applications (e.g., shallow trench isolation, pre-metal dielectric, intermetal dielectric or interlayer dielectric). The invention may also be used in other contexts such as in manufacturing displays or in any application involving controlled removal of thin layers of two or more different materials from a substrate. These two or more different materials may be nitride and oxide layers that may both exist on the surface of the substrate or one below another. Etching of nitride and oxide layers with gaseous reactants is modulated by etching in different process regimes. High silicon nitride etch selectivity is achieved in an adsorption regime where the partial pressure of the etchant is lower than its vapor pressure. Low silicon nitride etch selectivity is achieved in a condensation regime where the partial pressure of the etchant is higher than its vapor pressure. By controlling partial pressure of the etchant, silicon nitride etch selectivity of greater than 70, greater than about 100, or up to about 200 may be achieved.

In one aspect, the present invention pertains to a method of selectively etching an oxide from a surface of a workpiece having the oxide and a liner, e.g., a nitride, on features of the surface via a 2-step process. During the first step, method includes exposing the workpiece to an etchant under conditions such that the oxide is etched quickly while it oxide/nitride interface is still not exposed to etchant. This is done via thermodynamically favor condensation of the etchant onto the feature, allowing the etchant to etch oxide from the feature. For this step, the etch selectivity of oxide to nitride is characterized as "low". During the second step, the etch selectivity of oxide to nitride is changed to "high" by exposing the workpiece to the etchant under conditions that thermodynamically favor adsorption but not condensation of the etchant onto the feature, and allowing the adsorbed etchant to selectively etch oxide from the feature without substantially etching the nitride.

The conditions that thermodynamically favor condensation of the etchant onto the feature are conditions in which the partial pressure of the etchant in a chamber housing the workpiece is greater than the vapor pressure of the etchant. For ammonium fluoride and/or ammonium bifluororide etchants, the partial pressure for condensation at the workpiece surface may be about 10-15 mTorr, or about 10-13 mTorr. The conditions that thermodynamically favor adsorption but not condensation of the etchant onto the feature are conditions in which the vapor pressure of the etchant is greater than the partial pressure of the etchant in a chamber housing the workpiece. For ammonium fluoride and/or ammonium bifluororide etchants, the partial pressure for adsorption and not condensation may be about 1-10 mTorr, or about 5-8 mTorr. The workpiece temperature may be maintained at about 10 to 50° C., or about 25° C. during the etching operations. If the workpiece temperature is too high, then the etchant may not adsorb nor condensate. Note that the controlling partial pressure is at the workpiece surface. Because the workpiece temperature and the bulk chamber temperature need not be the same, the bulk vapor pressure may be higher in the chamber if the chamber has a higher temperature than the workpiece.

The etchant may be a halide etchant, such as ammonium fluoride and/or ammonium bifluoride. Ammonium fluoride and/or ammonium bifluororide etchants may be introduced directly into the chamber or created in situ by combining reactants with hydrogen-containing and fluoride species. The hydrogen-containing reactant may include one or more of ammonia ($NH_3$), hydrogen ($H_2$) or water vapor ($H_2O$). The fluorine-containing reactant may contain one or more of hydrogen fluoride (HF), fluorine ($F_2$) or nitrogen trifluoride ($NF_3$). In a preferred embodiment, the reactants are ammonia and hydrogen fluoride. The hydrogen- and fluorine-containing reactants may be introduced into the chamber concurrently or sequentially. In some embodiments, a plasma may be employed to aid in activating reactants and/or creating the ammonium fluoride etchant. The plasma may be created in the chamber or in the delivery lines or another chamber leading to the main reaction chamber (i.e., a downstream plasma).

The nitride may be silicon nitride deposited by LPCVD, plasma enhanced chemical vapor deposition (PECVD), atomic layer deposition (ALD) or pulsed deposition layer (PDL) processing, or HDPCVD. The oxide may be silicon oxide deposited by thermal oxidation, a flowable process including spin-on-glass (SOG), PECVD, atomic layer deposition (ALD) or pulsed deposition layer (PDL) processing, sub-atmospheric chemical vapor deposition (SACVD) or HDPCVD. Thus the oxide deposition is not limited to CVD type methods, spin-on deposition may also be used. The silicon oxide may be undoped silicon oxide (USG) or doped silicon oxides such as phosphosilicate glass (PSG), borosilicate glass (BSG), or borophosphosilicate glass (BPSG). The oxide may also be non-silicon oxide, such as hafnium oxide, titanium oxide, tantalum oxide, aluminum oxide or zirconium oxide or oxide of Barium Strontium Titanate (BST). This method may be particularly useful in gap fill, where a high-aspect ratio trench is to be filled with a material, e.g., silicon oxide, without voids. One gap fill application is shallow trench isolation. In order to fill the high-aspect ratio feature from the bottom, some deposited material is removed during the process in a deposition-etch-deposition process sequence. One or more of the operations in the process may be repeated within the larger sequence. For example, a process may be deposition-etch-deposition-etch-deposition. One or more of the operations in the etch method may also be repeated to finely control the amount of material etched. For example, as the etching near completion and more underlying material, such as silicon nitride becomes exposed, the operations may be modified or repeated in such way as to increase the etch selectivity to the underlying material, e.g., silicon nitride, in each successive operation. The methods of the present invention are applicable to all situations of filling a high-aspect ratio trench, not only for shallow trench isolation, where a critical liner of silicon nitride is present and not to be damaged.

Every operation of this method may be performed in a single chamber or in different chambers. The chambers may be single station or multiple station chambers. The single chamber may be a multiple station sequential processing chamber having two or more stations. The single chamber may also be a single station chamber that performs all operations. In a multiple station chamber, each operation or groups of operations may be performed at one station and the substrate moved from one station to another for subsequent operations.

The present invention also pertains to a semiconductor processing apparatus configured to perform the etching operation. The apparatus may include a chamber for receiving the workpiece and holding it during etching, a pedestal or other surface for supporting the workpiece during etching, a temperature controller capable of heating or chilling the workpiece, a pressure controller, an inlet to the chamber for delivering the etchant or precursors of the etchant, an outlet leading to a vacuum source, an optional plasma source, and a controller. The controller may execute a set of instructions to expose the workpiece to an etchant under conditions that thermodynamically favor condensation of the etchant onto the feature; allow the etchant to etch oxide from said feature; expose the workpiece to the etchant under conditions that thermodynamically favor adsorption but not condensation of the etchant onto the feature; and, allow the adsorbed etchant to selectively etch oxide from the feature without substantially etching the nitride.

In another aspect, the present invention pertains to a method of selectively etching an oxide from a surface of a workpiece having the oxide and nitride on regions of the surface. The method includes exposing the workpiece to an ammonium halide etchant under conditions that deposit at least a partially saturated layer of the etchant onto the regions of said surface; and allowing the deposited etchant to selectively etch oxide from the feature without substantially etching the nitride, wherein an etch selectivity for the oxide over the nitride is at least about 50:1, 70:1, 100:1, or about 200:1. The ammonium halide etchant may be ammonium fluoride and/or ammonium bifluoride. The nitride may be deposited by any preferred deposition method, including LPCVD, PECVD, ALD, PDL, and HDPCVD. The oxide may be deposited by any preferred deposition method, including thermal oxidation, a flowable process (including SOG), PECVD, ALD, PDL, SACVD and HDPCVD. The oxide may comprise silicon oxide, hafnium oxide, titanium oxide, tantalum oxide, aluminum oxide or zirconium oxide. The operations of this method may be performed in a single chamber or in separate chambers. During the operations, the workpiece temperature may be maintained at less than about 100° C., 10 to 50° C., or at about 25° C.

The conditions that deposit at least a partially saturated layer of the etchant onto the regions of said surface are conditions that thermodynamically favor adsorption but not condensation of the etchant onto the feature. The adsorption favored conditions are conditions in which the vapor pressure of the etchant is greater than the partial pressure of the etchant in a chamber housing the workpiece. The vapor pressure of ammonium fluoride and/or ammonium bifluoride etchants for the adsorption regime may be about 1-10 mTorr or about 5-8 mTorr. These etchants may be introduced directly into the chamber or created in situ by combining reactants with hydrogen-containing and fluoride species. The hydrogen-containing reactant may include one or more of ammonia ($NH_3$), hydrogen ($H_2$) or water vapor ($H_2O$). The fluorine-containing reactant may contain one or more of hydrogen fluoride (HF), fluorine ($F_2$) or nitrogen trifluoride ($NF_3$). In a preferred embodiment, the reactants are ammonia and hydrogen fluoride. The hydrogen- and fluorine-containing species may be introduced into the chamber concurrently or sequentially. In some embodiments, a plasma may be employed to aid in activating reactants and/or creating the ammonium fluoride etchant. The plasma may be created in the chamber or in the delivery lines or another chamber leading to the main reaction chamber (i.e., a downstream plasma). The selective etching method in the adsorption regime may be particularly useful for gap fill, contact preclean, and pre-silicide cleaning.

In yet another aspect, the present invention pertains to a method of selectively etching an oxide from a surface of a workpiece having the oxide and nitride on a feature of the surface. The method includes exposing the workpiece to the etchant under conditions that thermodynamically favor adsorption but not condensation of the etchant onto the regions of the surface and allowing the adsorbed etchant to selectively etch oxide from the feature without substantially etching the nitride. Under the adsorption regime, the etch selectivity for the oxide over the nitride is at least about 50:1, 70:1, 100:1, or about 200:1. The adsorption favored conditions are conditions in which the vapor pressure of the etchant is greater than the partial pressure of the etchant in a chamber housing the workpiece. The vapor pressure of ammonium fluoride and/or ammonium bifluoride etchants for the adsorption regime may be about 1-10 mTorr or about 5-8 mTorr at the workpiece surface. During the operations, the workpiece temperature may be maintained at about 0 to 50° C., or at about 25° C. As noted above, the bulk chamber temperature may be different from that of the workpiece temperature. Thus the bulk vapor pressure of the etchant may be more or less than that specified above at the workpiece surface.

These etchants may be introduced directly into the chamber or created in situ by combining reactants with hydrogen-containing and fluoride species. The hydrogen-containing reactant may include one or more of ammonia ($NH_3$), hydrogen ($H_2$) or water vapor ($H_2O$). The fluorine-containing reactant may contain one or more of hydrogen fluoride (HF), fluorine ($F_2$) or nitrogen trifluoride ($NF_3$). In a preferred embodiment, the reactants are ammonia and hydrogen fluoride. The hydrogen- and fluorine-containing species may be introduced into the chamber concurrently or sequentially. In some embodiments, a plasma may be employed to aid in activating reactants and/or creating the ammonium fluoride etchant. The plasma may be created in the chamber or in the delivery lines or another chamber leading to the main reaction chamber (i.e., a downstream plasma). The selective etching method in the adsorption regime may be particularly useful for gap fill, contact preclean, and pre-silicide cleaning.

In another aspect, the present invention also pertains to the logic for selecting etching conditions in the adsorption or condensation regime depending on a desired etch selectivity. The logic may be a method to selectively etch an oxide from a surface of a workpiece having the oxide and a nitride on a feature of the surface. The method may include determining or receiving an indication that an etching application requires a highly selective etch for the oxide over the nitride, exposing the workpiece to the etchant under conditions that thermodynamically favor adsorption but not condensation of the etchant onto the feature, and allowing the adsorbed etchant to selectively etch oxide from the feature without substantially etching the nitride. Alternatively, a method may include the determining or receiving an indication operation that a highly selective etch is not required or that a low selectivity etch is required. In that case, the method to use would depend on the etch rate based on a desired throughput. The indication may come from an operator interfacing with a controller of a semiconductor processing apparatus or from a fab operating system connected to the semiconductor processing apparatus. The determining operation may include some calculation by the controller based on the material to be etched, the amount to be etched, and the relative position of the etching step in the integrated circuit fabrication process.

In yet another aspect, the present invention pertains to an apparatus for etching an oxide from a surface of a workpiece having the oxide and a nitride on a feature of the surface. The apparatus may include a chamber for receiving the workpiece and holding it during etching, a pedestal or other surface for supporting the workpiece during etching, a temperature controller capable of heating or chilling the workpiece, a pressure controller, an inlet to the chamber for delivering the etchant or precursors to the etchant, an outlet leading to a vacuum source, an optional plasma source and a controller. The controller may be configured to execute a set of instructions that may include instructions for receiving an indication or for determining that an etching application requires a high selectivity etch for the oxide, exposing the workpiece to the etchant under conditions that thermodynamically favor adsorption but not condensation of the etchant onto the feature to thereby facilitate the high selectivity etch, and allowing the adsorbed etchant to selectively etch oxide from the feature without substantially etching the nitride. The controller may further execute instructions for receiving an indication or determining that an etching application requires a low selectivity etch for the oxide, exposing the workpiece to the etchant under conditions that thermodynamically favor condensation of the etchant onto the feature to thereby facilitate the low selectivity etch, and allowing the condensed etchant to selectively etch oxide from the feature. The indication may come from an operator interfacing with a controller of a semiconductor processing apparatus or from a fab operating system connected to the semiconductor processing apparatus. The determining operation may include some calculation by the controller based on the material to be etched, the amount to be etched, and the relative position of the etching method in the integrated circuit fabrication process.

The chamber may be a multistation chamber where each station includes a workpiece holder, and an inlet for delivering the etchant or precursors to the workpiece. In some embodiments, pressure gas flow and temperature for each station is controlled separately so that the process conditions may vary between stations. In other embodiments, pressure for the entire chamber is controlled and the process pressure for the entire chamber would be the same. The apparatus may also include a workpiece cache and workpiece handlers to transfer workpieces between the cache and the chamber or between multiple chambers.

These and other features and advantages of the invention will be described in more detail below with reference to the associated drawings.

DETAILED DESCRIPTION OF A PREFERRED EMBODIMENT

Aspects of the present invention are directed to etching of materials from substrates using an atomic layer removal (ALR™) process, such as partially fabricated integrated circuits. While the methods of present invention find particular use in the processing of semiconductor substrates, they can also be employed in other applications, such as removal of oxide material from other workpieces such as those employed in flat panel display manufacturing.

Fluorine and Hydrogen Gas Based Selective Etching

The fluorine- and hydrogen-containing gas based selective etching of silicon oxide is a two-step process. The first step is the etching of silicon oxide by exposing the silicon oxide surface to fluorine- and hydrogen-containing species, or alternatively, to other precursors that would form the ammonium fluoride or ammonium bifluoride etchant, or directly to the etchants. The hydrogen-containing reactant may include one or more of ammonia ($NH_3$), hydrogen ($H_2$) or water vapor ($H_2O$). The fluorine-containing reactant may contain one or more of hydrogen fluoride (HF), fluorine ($F_2$) or nitrogen trifluoride ($NF_3$). In a preferred embodiment, the reactants are ammonia and hydrogen fluoride. The etching reaction will leave a layer of etching products $(NH_4)_2SiF_6$ (ammonium hexafluorosilicate or AHFS) and $H_2O$ on the wafer. The second step is the removal of the product layer by heating the wafer to an elevated temperature at which AHFS sublimates.

Several different fluorine- and hydrogen-containing gas based selective etching technologies have been reported. Nishino et al. (U.S. Pat. No. 5,030,319 which is incorporated herein by reference for all purposes) describes an etching method in which $NF_3$ and $NH_3$ gases are reacted in a microwave plasma forming ammonium fluoride ($NH_4F$) and ammonium bifluoride ($NH_4FHF$), which deposit onto the wafer as the etchants. Similar methods employing etchants produced by the plasma reaction of $NH_3$ and $NF_3$ were described by Phan et al. in a communication at SEMICON Korea (2006, pp. 157-163, incorporated herein by reference for all purposes). Jeng et al. (U.S. Pat. No. 5,282,925 incorporated herein by reference for all purposes) describes an etching method in which $NH_3$ and HF gases are simultaneously introduced into the reaction chamber and etch the silicon oxide surface.

There are other publications on fluorine and hydrogen gas based etching. None of them reported higher than 20:1 etch selectivity of $SiO_2$ over $Si_3N_4$. Especially for gap fill applications, fluorine- and hydrogen-containing gas based etching are typically performed at high process pressure where the etch rate is high. At those process pressures, the etch selectivity of $Si_3N_4$ with reference to $SiO_2$ is low because the silicon nitride etch rate is much higher at higher process pressure.

Figure 1:
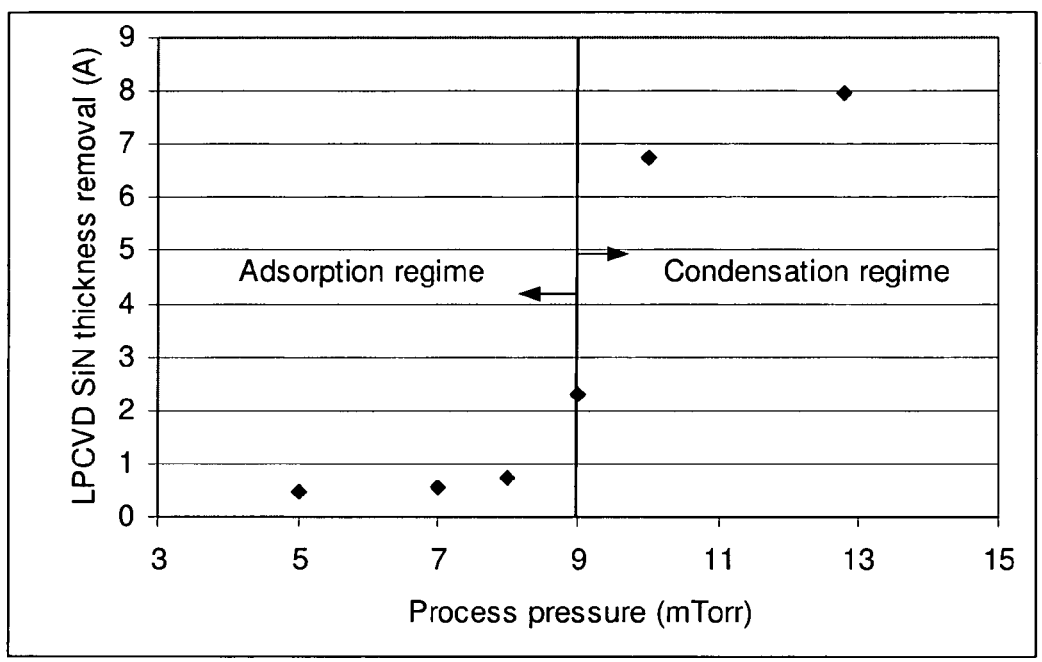
FIG. 1 is a plot of LPCVD silicon nitride thicknesses etched over various process pressures.

The inventors have discovered that under some process conditions, HF—$NH_3$ gas based etching of LPCVD silicon nitride can be divided into two regimes, each with very different etch rates and selectivities. Within each regime, the LPCVD silicon nitride etch rate changes gradually with process pressure while in the transition region between the two regimes, the LPCVD silicon nitride etch rate changes sharply with process pressure. FIG. 1 is a plot of LPCVD silicon nitride thickness removed for various process pressures from about 5-13 mTorr for two minutes under same conditions. When the process pressure changes from about 5 mTorr to 8 mTorr, the silicon nitride thickness removed changed from about 0.5 Å to 0.7 Å, or about 28%. The etch rate is low and the change is small. When the process pressure changed from about 10 mTorr to 12.8 mTorr, the silicon nitride thickness removed changed from about 7 Å to 8 Å, or about 14%. Although the absolute change of thickness removal is 1 Å, the relative change was small. As process pressure changed from about 8-10 mTorr, the silicon nitride thickness removed changed from 0.7 Å to 7 Å (FIG. 1), or about 900%. The large difference in etch rate change can be characterized by an etching regime change. It is believed that a "threshold" pressure, or pressure range, exists between two etching regimes. In the first regime, the etch rates are low. Although the relative etch rate change over the process pressure change of 3 mTorr may be about 28%, the absolute change is very small (0.2 Å). At around the threshold process pressure, the etch rate increases dramatically, about an order of magnitude over a relatively small process pressure increase (about 2 mTorr, from 8-10 mTorr). In the second regime, the etch rate is high. Over about a 3 mTorr change in process pressure, the etch rate increased relatively little (about 12.5%).

Vapor pressure is the pressure of a vapor in equilibrium with its non-vapor phases. At any given temperature, for a particular substance, there is a partial pressure at which the gas of that substance is in dynamic equilibrium with its liquid or solid forms. This is the vapor pressure of that substance at that temperature. Partial pressure of a substance in a mixture of gases, on the other hand, is the pressure which the gas would have if it alone occupied the volume. The total pressure of a gas mixture is the sum of the partial pressures of each individual gas in the mixture.

Under appropriate conditions, all solids and liquids have a tendency to evaporate to a gaseous form, and all gases have a tendency to condense back. Condensation is the change in matter of a substance from a gas (or vapor) to a liquid. Condensation commonly occurs as a vapor is cooled or compressed or both. Vapor will condense onto another surface when that surface is cooler than the temperature of the vapor, or when the vapor equilibrium has been exceeded (i.e., the partial pressure is higher than the vapor pressure). Evaporation is the process by which molecules in a liquid state spontaneously become gaseous, without being heated to boiling point. Generally, evaporation can be seen by the gradual disappearance of a liquid, when exposed to a significant volume of gas. Thus, condensate would evaporate and become gas again. During fluorine- and hydrogen-containing gas based etching, the etchant formed in the chamber has a partial pressure, which equals the chamber pressure if it is the only gas present.

Absorption is the process in which a gas (or vapor) accumulates on a surface. The gas forms an adsorbate film on the surface. This adsorbate may be physisorbed or chemisorbed to the surface, depending on the type of bonding that is most energetically favorable (i.e., Van der Waals bonds or chemical bonds). Desorption is the reverse process in which an adsorbate transitions back to a free gaseous state.

Without being bound to this theory, it is believed that the "threshold" pressure is related to the vapor pressure of the precursors (e.g., HF—NH$_3$) and/or the etchants. In the first regime, the partial pressure of the etchant(s) (e.g., NH$_4$F or NH$_4$FHF) is lower than its vapor pressure and there is no etchant condensation on the surface. The etchant supply to the surface is from the adsorbed etchant molecules. The etchant density on the surface is limited by the activation energy of adsorption. Therefore the etch rate is low. This first regime is said to be the adsorption regime.

In the second regime, the partial pressure of the etchant(s) is higher than its vapor pressure and causes etchant condensation on the surface. Since there is no limit on how much etchant(s) can condense on the surface, the etchant density on the surface is typically much higher. The significant increase in etchant density on the surface causes a large increase of etch rate. This second regime is said to be the condensation regime. As mentioned above, some etchant condensate may evaporate. This evaporation may be limited if total chamber pressure is high, as some evaporated etchant may be reflected back to the substrate.

Figure 2:
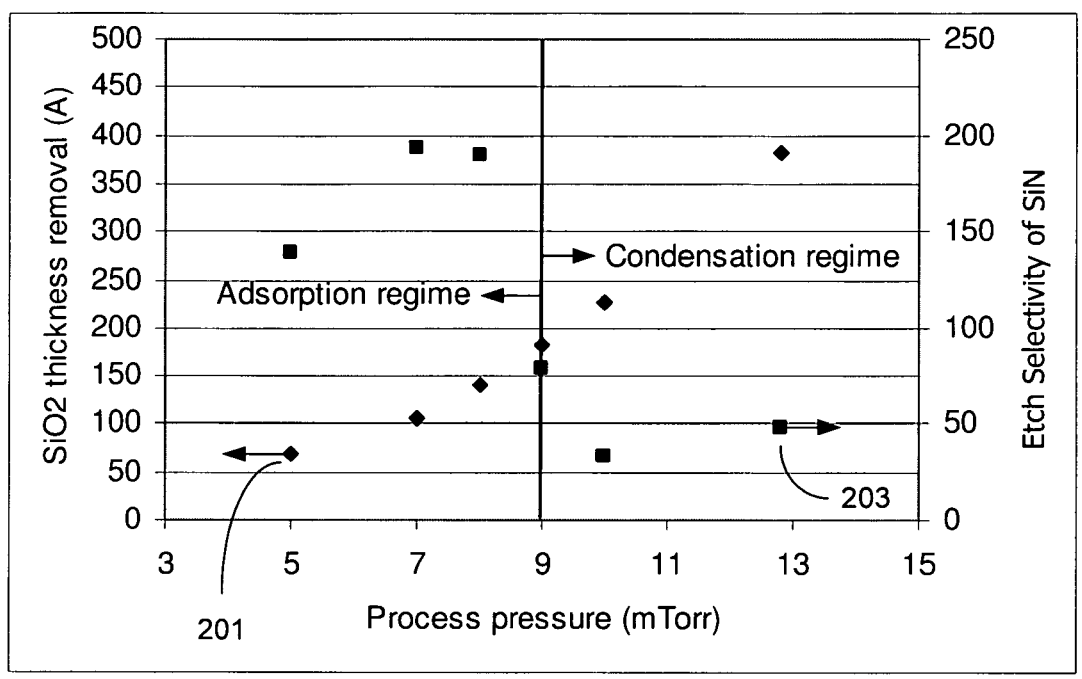
FIG. 2 is a plot of silicon oxide thicknesses etched and silicon nitride etch selectivity over various process pressures.

Unlike silicon nitride, the etching reaction of silicon oxide is much less sensitive to the etchant density, as indicated by its partial pressure. The relative increase in etch rate of silicon oxide with process pressure is much slower than that of silicon nitride. FIG. 2 includes a plot of silicon oxide thickness removed for the same etch conditions shown as diamond shaped data points, e.g., 201. The thickness removed increased smoothly as the process pressure increased. The amount of silicon oxide removed increased from about 70 Å to about 140 Å between about 5-8 mTorr; the increase is about 50% or greater. From about 10-13 mTorr, the silicon oxide removed increased from about 230 Å to about 380 Å, or about 40%. Through the threshold pressure range for LPCVD silicon nitride, at about 8-10 mTorr, the silicon oxide removed increased from about 140 to 230 Å, or about 40%. The change in silicon oxide etch rate relative to the process pressure did not vary sharply over this pressure range. At process pressure above about 7 mTorr, the change in etch rate with process pressure is relatively constant.

Because the etch rate changes for LPCVD silicon nitride and silicon oxide have different curves over the same process pressures, the etch selectivity of LPCVD silicon nitride, which is defined as the ratio of the etch rate of thermal SiO$_2$ to the etch rate of LPCVD silicon nitride under the same conditions, changes sharply from the adsorption regime to the condensation regime. FIG. 2 also includes a plot of the silicon nitride etch selectivity; the data point are shown as squares, e.g., data point 203. For example, at 8 mTorr process pressure, Si$_3$N$_4$ is etched by 0.74 Å and SiO$_2$ is etched by 140 Å under the same conditions, corresponding to an etch selectivity of 140:0.74=190:1. At 10 mTorr process pressure, Si$_3$N$_4$ is etched by 6.7 Å and SiO$_2$ is etched by 227 Å, with a selectivity of 227:6.7=33:1.

This observed difference may be used effectively in different applications to etch oxide quickly and precisely with little loss of silicon nitride. One of these applications is gap fill for shallow trench isolation (STI).

Shallow Trench Isolation

In the manufacturing of DRAMs with shallow trench isolation (STI) structures, a very thin liner (<100 Å) may be deposited on top of the silicon after the trenches are formed in the silicon surface. The liner may also be deposited on top of the CMP etch stop layer. This protective liner is a diffusion barrier for the active silicon and gate areas during subsequent thermal processing. The liner is often thin silicon nitride, e.g., Si$_3$N$_4$, deposited by low pressure chemical vapor deposition (LPCVD).

To properly fill high-aspect-ratio trenches with HDPCVD silicon oxide without significant voids in the film, multiple deposition-etch-deposition cycles are performed. Such in-situ HDPCVD deposition and etch-back processes are described, for example, in U.S. Pat. Nos. 6,335,261, 7,163,896, 6,030,881, 6,395,150, 6,794,290 and 6,867,086, the disclosures of which are incorporated herein by reference for all purposes. During this process, a layer of silicon oxide is first deposited in and around the trenches, partially-filling the trenches until the entrance of the trench, also called a gap, is partially obstructed by the silicon oxide. To continue filling the trench with silicon oxide, the obstructing silicon oxide and the silicon oxide on top of the trenches need to be etched without removing too much of the silicon oxide deposited in the bottom of the trench and without damaging an underlying liner. To avoid liner damage, the etch processes employed must have very high etch selectivity due to the very thin liner involved. At thicknesses of less than 100 Å, sometimes less than 50 Å, or even as low as 10 Å, any undesired removal of the protective liner may affects its ability to stop defect diffusion into the active silicon and gate. In the preferred embodiment, this means that the etch process must have a very high etch selectivity of silicon oxide to silicon nitride.

Figure 3A:
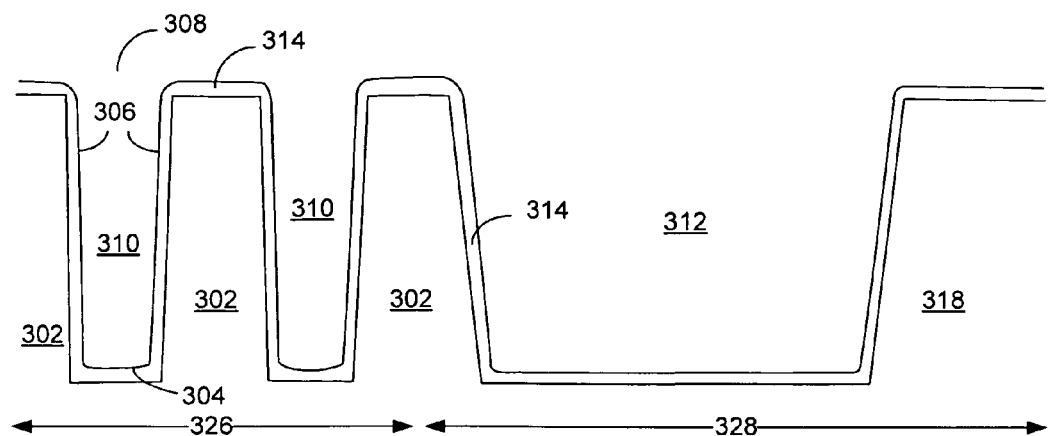
FIGS. 3A-I depict rough schematic cross-sectional diagrams of a multi-step gap fill process in accordance with the present invention.

A substrate may include two or more regions of differing feature density. Usually, one or more regions would have high density of features, and one or more regions would have isolated features, resulting in features with different aspect ratios. A cross section view of a substrate having these regions is illustrated in FIG. 3A. A region with high feature density, or "high density region," is shown by arrow 326. This region 326 includes gaps 310 and structures 302. A region with lower feature density, or "isolated features region," is shown by arrow 328. This region 328 includes gap 312 and structure 318. Only a part of the structure 318 is illustrated in FIG. 3A.

The gap may be defined its bottom 304, sidewalls 306 and entry region 308. The gaps 310 and 312 are generally lined with an oxide layer, such as a thermally grown silicon oxide layer 314. As such, a thin layer (e.g., 10-200 Å, for example 100 Å) of silicon oxide (314) is formed on the gap bottom 304 and sidewalls 306 prior to being filled with a gap fill material. The substrate surface next to the entry region 308 is also generally lined with the same oxide layer. The silicon oxide 314 passivates the silicon surface of the structures 302/318 and provides an electrically stable interface between the silicon and the gap fill material.

Figure 3B:
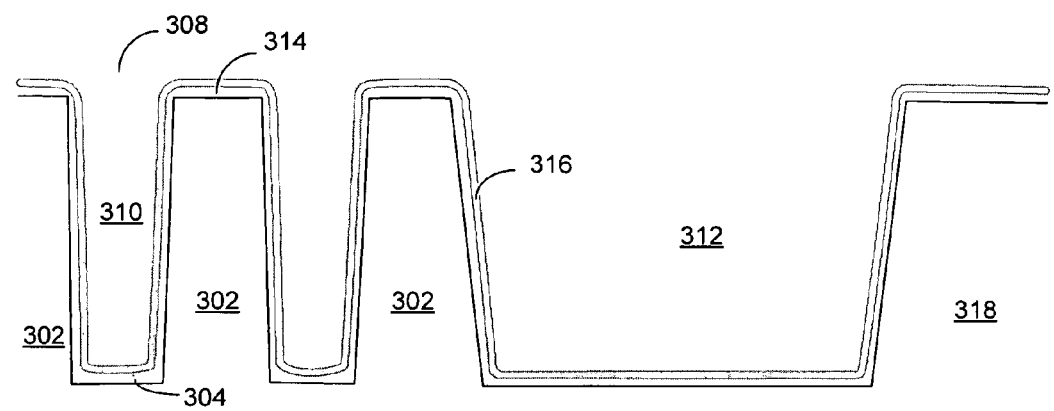

FIG. 3B shows the substrate cross section with a protective liner 316. The protective liner may be silicon nitride deposited using an LPCVD process. It may also be silicon nitride deposited using HDPCVD. Silicon nitride may also be deposited using other processes such as PECVD, ALD, or PDL. This silicon nitride protective liner 316 is an etch stop layer against subsequent etching on the sidewalls and the corners of the structures 302 and a diffusion barrier. This protective liner preferably remains substantially intact after the gap filling process.

Figure 3C:
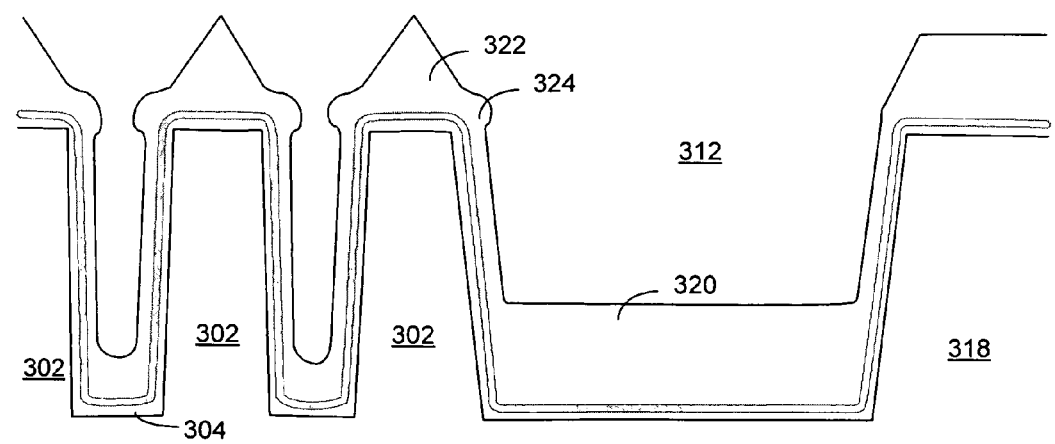

FIG. 3C shows partially filled gaps. The initial deposition partially fills gaps 310/312 with a dielectric 320 deposited by a high density plasma chemical vapor deposition (HDPCVD) process. The HDPCVD deposition performs bottom-up filling of the gap resulting in a thicker film on the bottom 304 than on the sidewall 306. However, the deposition also results in an overhang 324 (also called "pinch-off") at the entry region 308 of the gap 310 that narrows access to the high density region gap. Also, top hat formations 322 form on the substrate surface adjacent to the gap opening. The overhang results from the non-directional deposition reactions of neutral species in the plasma reactor and from sputtering/redeposition processes. Limitations due to overhang formation become ever more severe as the width of the gap to be filled decreases, the aspect ratio increases, and the features become reentrant (i.e., overhang structures are more severe in dense features).

A portion of the fill material 320 is reacted with one or more reactants, e.g., ammonium fluoride or ammonium bifluoride or precursors, to form a solid reaction product 330, e.g., AHFS. This reaction is preferably fast, with a high etch rate so that the gap opening may be cleared to allow more silicon oxide deposition into the gap bottom. However, care must be taken not to excessively etch the underlying protective layer, e.g. the $Si_3N_4$ liner. The solid reaction product 330 is shown as cross-hatched regions in FIG. 3D. The solid reaction product 330 has a specific volume greater than the fill material 320 it consumes, e.g., more than 2 times greater specific volume, preferably more than 3. The gaseous reactants react at the fill material surface. The solid reaction product 330 impedes diffusion of the reactants to the underlying fill material 320 as the solid reaction products 330 build. Thus, the fill material at the surface and the overhangs etches more than the fill material at the trench bottom.

The solid reaction product 330 formed at the overhangs 324 on either side of the gap opening substantially or totally closes the gaps 310 of features in dense regions after exposure to the reactants. Thus, little or no fill material from the gap bottom is consumed to form the reaction product. However, reactants continue to react with fill material on the surface of the substrate, e.g., the top hats 322 and the fill material on top of the structure 318 until the reaction goes to completion. Reaction also continues at all areas of the features in isolated regions, including the bottom of the feature. Therefore, more fill material is removed from the top of the gap than at the bottom in dense features while an approximately equal amount or material is removed from all areas in the isolated features. Since the gap bottom in the dense features receives less initial fill material deposition than in the isolated features this may result in more uniform gap fill across all regions of the substrate. In dense features, preserving the gap bottom fill while reducing the fill material on the sidewalls reduces the aspect ratio of the unfilled gap making it easier to fill with subsequent deposition steps. Note that whether the gap opening closes depends on the ratio of remaining opening after the first deposition and the thickness reacted. Generally, an opening less than four times the etch thickness will be closed by the solid reaction product.

In one embodiment, the reaction occurs in the condensation regime and reaches a self-limiting point where the solid reaction product 330 becomes too thick to permit further reaction of the underlying fill material in the dense features before the fill material at the top corner of the trench opening is completely etched. In this scenario, a self-limiting thickness of silicon oxide may be removed from the top surface next to the trench and at the trench opening. The amount removed depends on the reactant pressure and other process conditions. At higher reactant pressure, more fill material would be removed. The trench bottom fill is preserved because the fill there will only react with the limited amount of reactant that reached the trench bottom before the opening closed.

A small amount of the protective liner at the sidewalls and top corners of the gap may also react with the reactants. The etch selectivity for the silicon nitride protective liner relative to the silicon oxide fill material in the condensation regime may be greater than about 20:1, may be 30:1 or greater, or may be even greater than 35:1, or about 40:1. The reaction is self-limiting, so a repeatably controlled amount of fill material may be removed by allowing the reaction to complete, but that means also some protective liner will also be removed. Given the selectivity ratio of 30:1, for example, for every 200 angstroms of silicon oxide fill material removed about 7 angstroms of silicon nitride will be removed, assuming that the silicon nitride layer is exposed to the reactants at the same time as the silicon oxide fill material. In reality, the underlying silicon nitride layer is only exposed to the reactant material when all the silicon oxide fill material overlying it has been etched. Thus, the actual protective liner etched is much less than 7 angstroms, instead the thickness of silicon nitride liner etched is a percent of the silicon oxide over-etching. For example, if the self-limiting reaction thickness is 250 angstroms and the thinnest silicon oxide thickness over a protective liner is 180 angstroms, then the over-etching can be said to be about 70 angstroms and 2 angstroms of the silicon nitride liner would be etched.

To reduce the amount of protective liner etched even further, the reaction may be stopped before it reaches the self-limiting point. For example, if the fill material thickness at the thinnest part is less than the self-limiting reaction thickness, then the reaction, in the high etch rate condensation regime, is stopped just before the fill material at the thinnest part is completely removed. This thinnest part may be the top corner at the edge of the trench opening where the protective liner may be subjected to multiple etchings. The reaction may be stopped by removing the reactants or precursors of reactants from the chamber, either by evacuating or by flowing purging gas, or both.

Figure 3D:
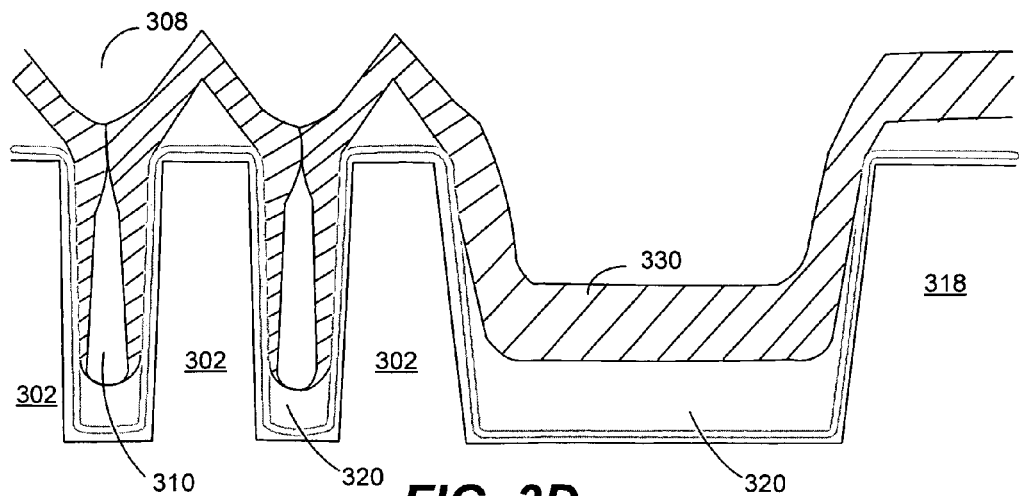
Figure 3E:
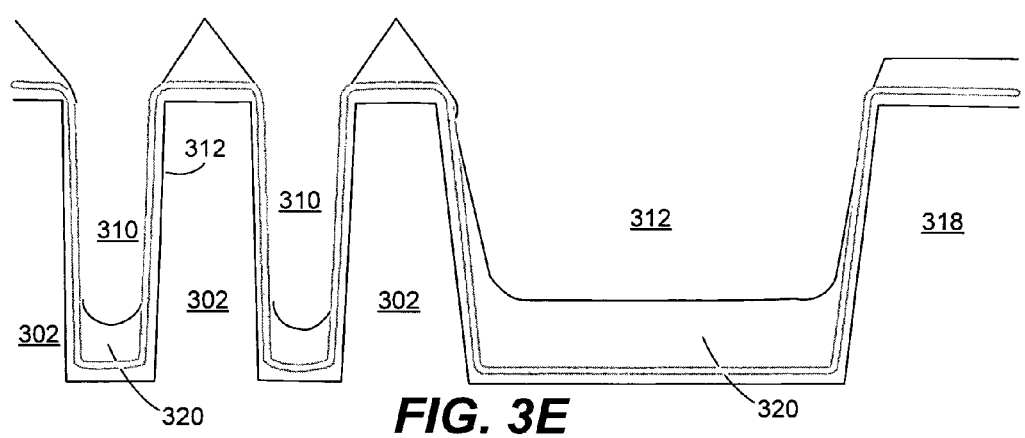

The solid reaction product 330 is removed by desorption. After the solid reaction product is removed, the unreacted fill material 320 is exposed, as shown in FIG. 3E. The solid reaction product is first decomposed into gaseous by-products (i.e., sublimated) and then removed by evacuation or purging. The decomposition is achieved by heating the substrate above the sublimation temperature of the solid reaction product, for example to at least about 100° C., or preferably to about 100-150° C. or more preferably to about 100-120° C.

In some embodiments, the ALR etch may continue in the adsorption regime to remove the remaining silicon oxide completely. As discussed above, the LPCVD silicon nitride liner has a very high etch selectivity in the adsorption regime. Although the etch rate in the adsorption regime is slower, the etch selectivity of LPCVD silicon nitride is much higher, up to about 200:1, so over-etching of silicon oxide fill material in this regime would not remove much silicon nitride at all. For example, if 10 angstrom of silicon oxide remains after the condensation regime etching and is over etched by 50 angstroms at the thinnest part, at an etch selectivity of about 200, only 0.4 angstroms of the silicon nitride would be removed.

The second etch step in the adsorption regime occurs after the solid reaction product 330 from the first condensation regime etch step is removed through sublimation. The solid reaction product from the second etch step in the adsorption regime is also removed by sublimation. After the solid reaction product sublimation, unreacted fill material and, in some parts, underlying layers are exposed. In the gap bottom of dense features, unreacted fill material remains because the etchant pathway to the gap bottom was substantially blocked by the solid reaction product at the gap opening. On the sidewalls of dense features, most if not all of the fill material has been removed, leaving a small amount of fill material or the exposed surface of the protective liner.

Figure 3F:
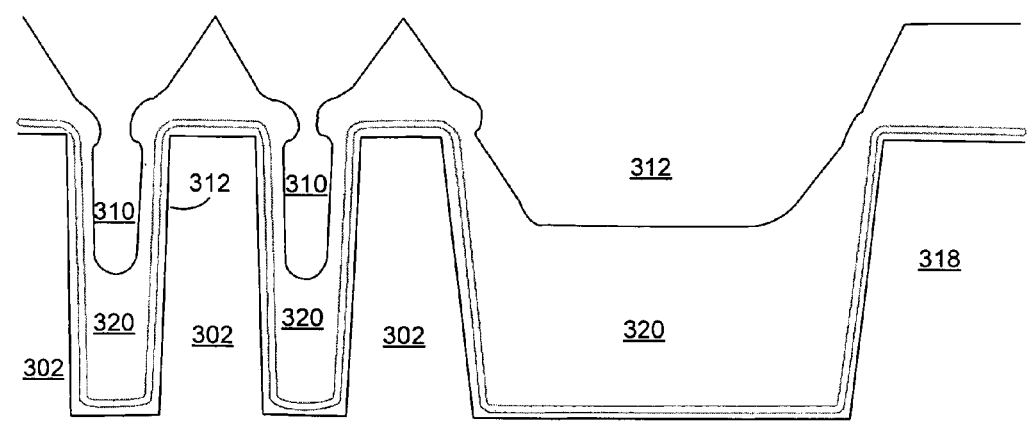

FIG. 3F illustrates the gap fill after a second deposition of fill material. In some cases, this second deposition of fill material would result in completely filled gaps. FIG. 3F shows a case where more than two depositions of fill material is necessary to fill the gap. The second deposition results in partially-filled gaps 310 and 312. Again more fill material is deposited in 312 than 310, as discussed above. Top hat and overhang structures again form in the high density regions of the substrate and are preferably removed by a second etch process, either by ALR or by plasma etch. The ALR etch may be a two step combination of condensation regime and adsorption regime etch or may be a condensation-regime-only etch, as described above.

Figure 3G:
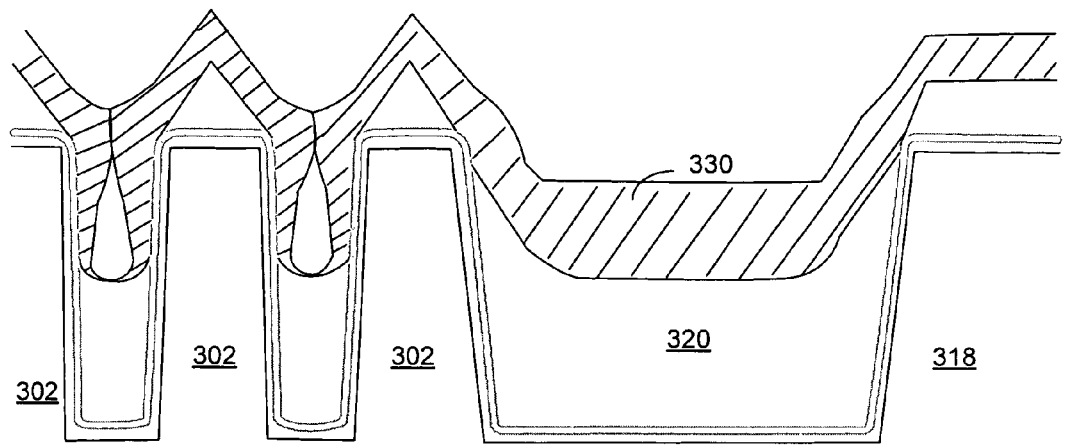
Figure 3H:
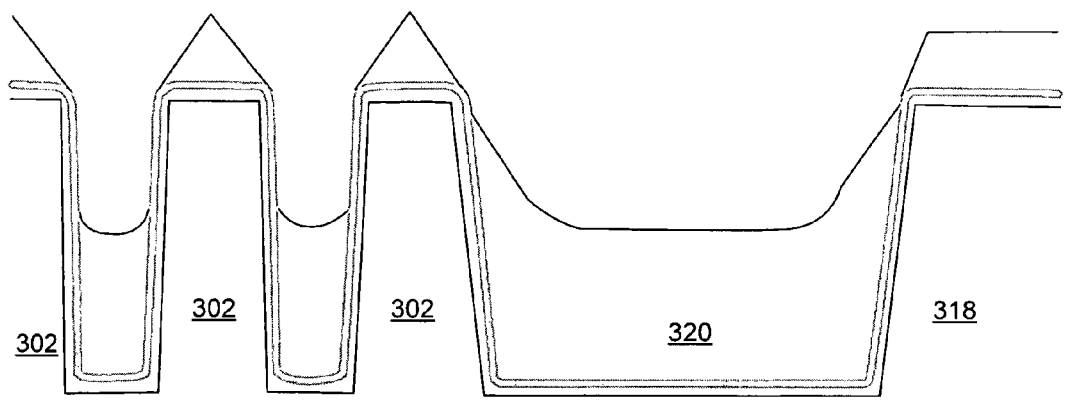
Figure 3I:
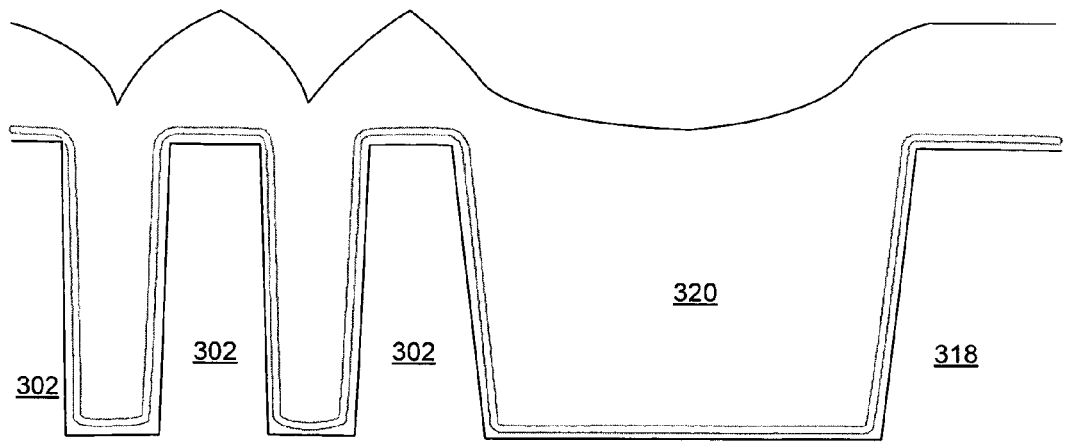

FIG. 3G shows the result of a second exposure to ALR reactants. The solid reaction product 330 from the overhangs closes the gap opening in dense features so little or no fill material from the gap bottom is reacted. The solid reaction product 330 is then sublimated to expose the unreacted fill material and protective liner as shown in FIG. 3H. A last deposition of fill material then fills gaps 310 and 312, as shown in FIG. 3I, without the presence of any seams, voids or weak spots.

Process

Figure 4:
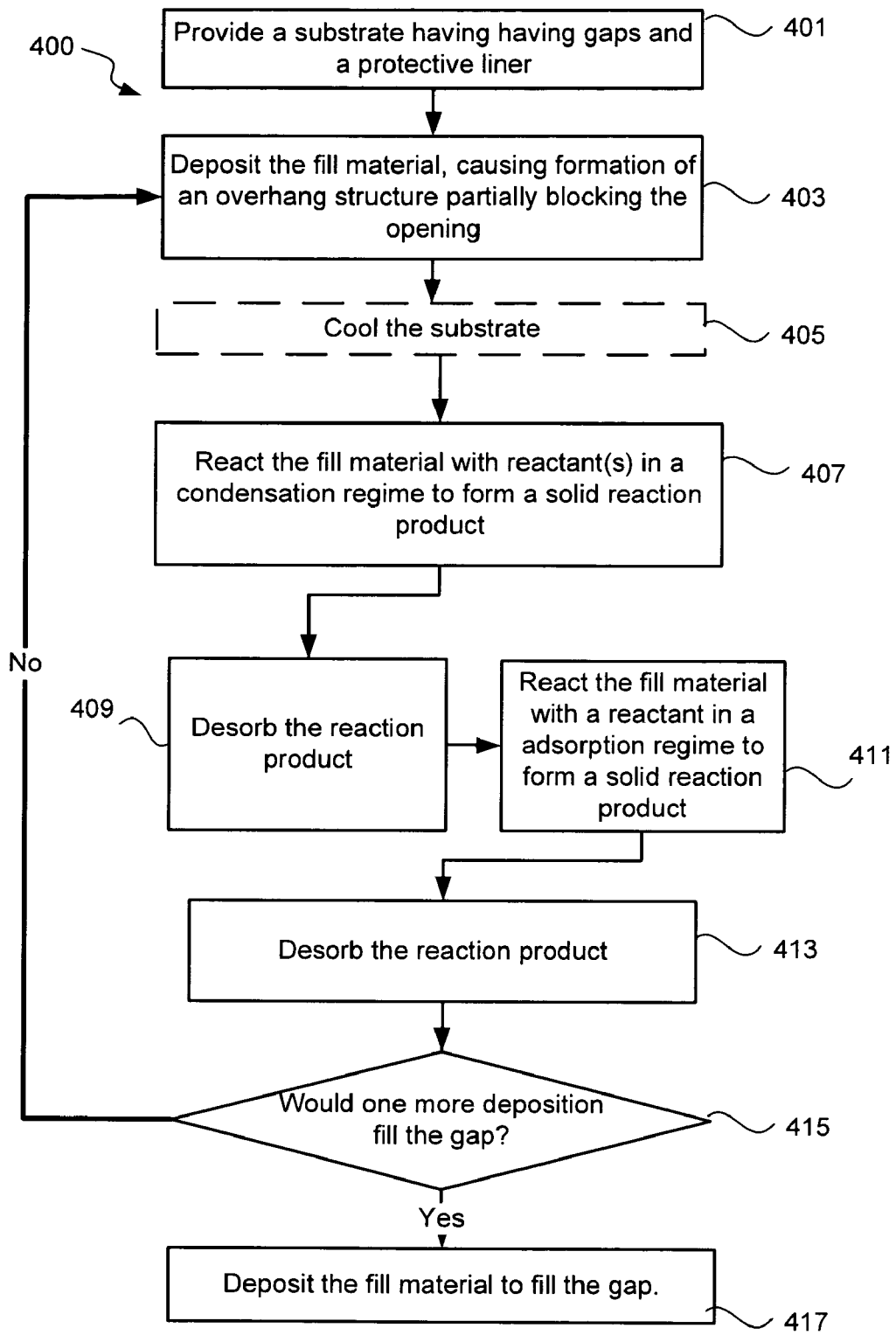
FIG. 4 is a process flow diagram depicting a process in accordance with the present invention.

One method embodiment of the present invention is shown in process flow diagram FIG. 4. At operation 401, a substrate having gaps with an exposed surface of silicon nitride is initially provided. This silicon nitride may be deposited using a low pressure chemical vapor deposition process (LPCVD) or a high density plasma (HDP) CVD process. Although the data from the etch selectivities were obtained for a LPCVD silicon nitride, it is believed that HDP CVD deposited silicon nitride has similar ALR etch properties. Thus the methods disclosed herein are equally applicable to HDP CVD deposited silicon nitride. The silicon nitride protective liner may have a thickness of 10-100 angstroms. Some or all the protective liner may act as defect diffusion barrier for the active silicon and gate areas. Some remaining portions may be sacrificial and be intended to be removed during the ALR etch process. The amount of liner integrated into the gap ultimately depends on the device application requirements. Generally, it is undesirable to remove the protective liner during the STI gapfill.

In operation 403, a fill material is deposited using an HDP CVD process. Such in-situ HDP CVD deposition and etch back processes are described, for example, in U.S. Pat. Nos. 6,335,261, 6,030,881, 6,395,150, and 6,867,086, the disclosures of which are incorporated by reference in its entirety herein. The fill material may be a dielectric such as silicon dioxide, USG, BSG, PSG, or BPSG. The fill material may also be deposited using a SACVD process. The fill material is deposited at the bottom and sidewalls of the gap, and on the surface of the substrate. The deposition continues until the fill material forms an overhang structure at the gap opening that partially blocks the opening, as shown in FIG. 3C.

In some embodiments, deposition of the silicon nitride and the fill material may occur in a different HDP CVD chamber from subsequent operations on the same tool. These operations may even occur in completely different semiconductor processing tools than subsequent operations. An advantage of the present invention is the ability to completely all operations in the same semiconductor tool and using same vacuum environment for all operations, but it is not required. A fill material may be deposited using an HDP CVD chamber configured on a tool, for example, an Ultima™ chamber, and the remaining process operations completed on another tool configured with a different HDP CVD chamber, for example, a SPEED™ chamber. If more than two fill operation is required, any of the fill operations may be completed independent of each other on different tools. Further, the fill material may be deposited using SACVD or HDP CVD. For example, the initial fill material may be SACVD silicon oxide, and second fill material may be HDP CVD, or vice versa.

The substrate is optionally cooled, in operation 405, if the substrate temperature is greater than about 50° C. before the next operation 407. In operation 407, the substrate is exposed to one or more reactants such that a portion of the fill material reacts with the reactants to form a solid reaction product. The solid reaction product has a specific volume greater than the fill material. The reaction product specific volume may be 2 times, preferably 3 times, that of the fill material so that the reaction product formed around the overhangs would substantially or totally block the gap opening in dense features to prevent reactants from reaching the fill material at the bottom of the gap, as shown in FIG. 3D.

In some embodiments, the gaseous reactants are ammonia ($NH_3$) and hydrogen fluoride (HF), in the proportion of approximately two parts ammonia to three parts hydrogen fluoride. The reaction may be the following:

$$2NH_3 + 3HF \rightarrow NH_4F + NH_4F.HF$$

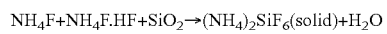

$$NH_4F + NH_4F.HF + SiO_2 \rightarrow (NH_4)_2SiF_6(solid) + H_2O$$

The solid reaction product is believed to be ammonium hexafluorosilicate. In other embodiments, the reactant may be hydrogen fluoride (HF) in the presence of moisture or other catalysts, in the following reactions:

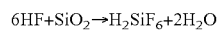

$$6HF + SiO_2 \rightarrow H_2SiF_6 + 2H_2O$$

$$H_2SiF_6 \rightarrow SiF_4\uparrow + 2HF\uparrow$$

The resulting hexafluorosilicic acid ($H_2SiF_6$), immediately dissociates into gaseous products, such as silicon tetrafluoride and hydrofluoric acid. Therefore the HF etch in the presence of small amounts of water may be a viable method of silicon dioxide removal under essentially "dry etch" conditions.

In still other embodiments, the reactants may include hydrogen ($H_2$), nitrogen trifluoride ($NF_3$), $NH_4F$, and $NH_4F$:HF. Ammonium fluoride ($NH_4F$) or ammonium bifluoride ($NH_4F.HF$) may be directly introduced into the chamber, instead of being formed from ammonia and hydrogen fluoride, or other reactants, e.g., ammonia ($NH_3$), hydrogen fluoride (HF), hydrogen ($H_2$), nitrogen trifluoride ($NF_3$), nitrogen ($N_2$), nitric oxide (NO), nitrous oxide ($N_2O$), nitrogen dioxide ($NO_2$), and water vapor ($H_2O$).

Figure 5:
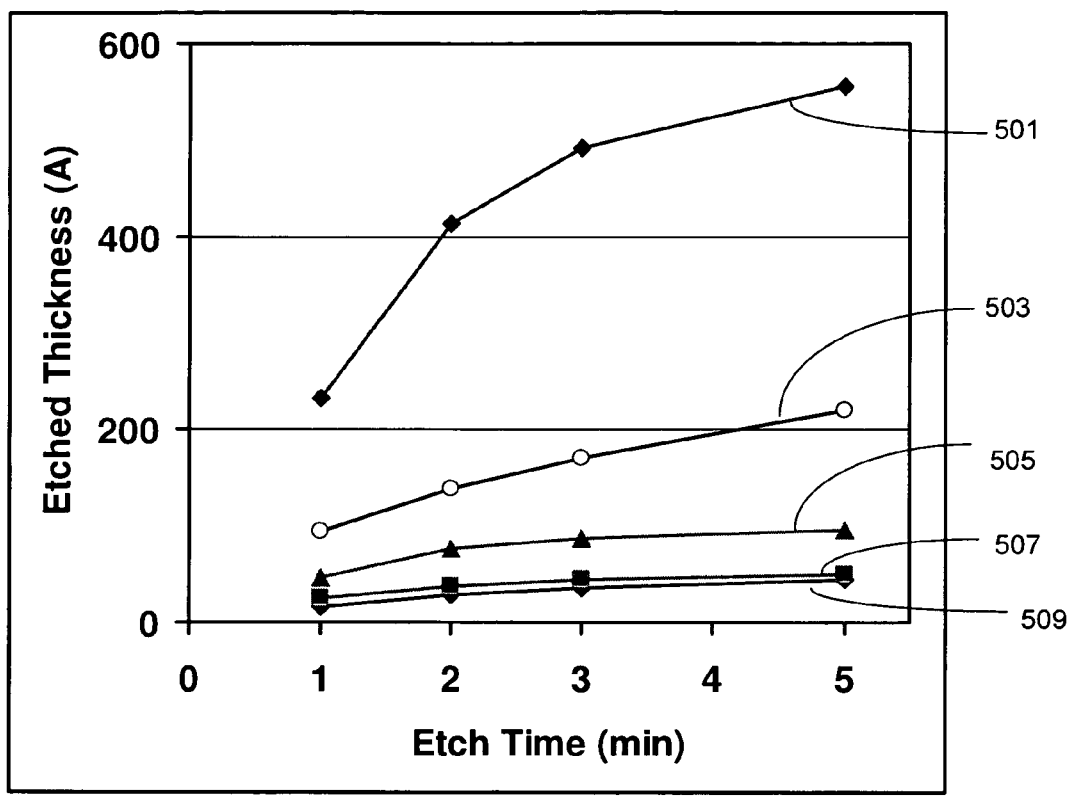
FIG. 5 is a chart showing the thickness of thermal oxide removed over time for different process pressures.

The substrate is exposed to a dose of the reactant mixture for a period of about 10 to 240 seconds, preferably for about 30 to 90 seconds, in the condensation etch regime. The duration of the exposure depends on the desirable amount to be etched and the process pressure. FIG. 5 shows a plot of thermal oxide thickness etched versus time for various pressures in the etch chamber. Line 501 corresponds to a vapor pressure of 13 mTorr in the etch chamber. Line 503 corresponds a vapor pressure of 8 mTorr. Line 505, 507, and 509 correspond to 6, 4, and 3 mTorr, respectively. The thickness etched increases with time, but the slope decreases with time (i.e., the etch rate decreases with time). At low vapor pressures, the etch thickness increases very little after about 2-3 minutes. At higher vapor pressures, the etch thickness appears to continue to increase. After sufficient time, the reaction reaches a self-limitation where prolonged exposure would not result in more etching. It is believed that the solid reaction product becomes so thick that reactants can no longer diffuse through the solid reaction product to the fill material surface below to react. Although the plot is of thermal oxide, which may not be the fill material, it is demonstrated the HDPCVD and other silicon oxide reacts similarly to ALR etch. In one test, the etch selectivity of HDPCVD silicon oxide over thermal oxide is 1.1:1.

As the reactant pressure increases, more oxide is reacted over the given time range. In other words, higher chamber pressure means that the self-limiting thickness is greater. Still, for each chamber pressure, the reaction is self-limiting. Thus, the reaction can be controlled by chamber pressure and by exposure time. One skilled in the art would be able to set process parameters, these and others, to remove a predetermined amount of fill material. In the condensation etch regime, fill material etches at a high rate, thus less time is required to etch a given amount of material.

In order to protect the liner from the lower selectivity in the condensation etch regime, the ALR etch may be stopped just before the fill material at the thinnest part is completely etched. Because the substrate includes various formations, the fill material thickness will vary over the surface. Stopping the reaction may be accomplished by evacuating the chamber of the reactants or flowing purge gas or both. After the condensation etch regime reaction is stopped, the solid reaction product is desorbed. The solid reaction product may be removed by decomposition and evacuation or purging, in operation 409. It is believed that the solid reaction product, ammonium hexafluorosilicate, will decompose and sublimate at temperature of greater than about 100° C., preferably about 100-150° C., and even more preferably about 100-120° C. The ammonium hexafluorosilicate product may sublime and get removed from the substrate upon heating. It may also decompose together with sublimation at those temperatures as follows:

$(NH_4)_2SiF_6 \rightarrow SiF_4\uparrow + NH_3\uparrow + HF\uparrow$

The decomposition products of $SiF_4$, $NH_3$, and HF are all gases that can be readily evacuated or purged. The removal may be accomplished by one or more vacuum sources coupled to the chamber or station, with or without an inert purge gas. Removal of the solid reaction product exposes unreacted fill material below as shown in FIG. 3E.

The remaining fill material may be etched in the adsorption regime at a slower etch rate (411). In the adsorption regime, the liner has a very high etch selectivity, up to about 200:1. Over-etching of the fill material in the adsorption regime may remove some of the liner, but the amount may be so small so as to be negligible. Some over-etching of the fill material may be desirable to completely remove the fill material from the top hat and overhang regions so that subsequent deposition better fills the gap. Note that the trench bottom fill may not be protected from the ALR reactants during the adsorption regime etching as the gap will no longer be closed by the solid reaction product after it is desorbed in operation 409. However, the adsorption regime etching seeks to remove only a small amount of fill material and a small reduction in bottom fill is to be expected. After the ALR etch operation in the adsorption regime, the solid reaction product is desorbed or removed by sublimation followed by evacuation and/or purging (413).

In some instances, only one deposition is required to fill the remaining gap after the 2-step ALR etch. At least in some cases more than one deposition/etch sequence is required to completely fill the gap. In one embodiment, operations 403-415 may be repeated as necessary to completely fill the gap if the remaining gap cannot be filled in one deposition (see operation 415). In other embodiments, operations 407-411 in a subsequent dep/etch sequence may be replaced by an HDP plasma etch, either a sputter etch, a reactive plasma etch or a combination of the two. For example, after the initial fill material deposition and ALR etch processes, a second fill material deposition may be conducted using typical HDPCVD conditions. The deposition continues until the fill material forms an overhang structure at the gap opening to partially block the opening. Then the overhang structure may be removed using an HDP sputter etch, reactive plasma etch, or sequential or simultaneous combination of the two. Additional HDPCVD deposition/etch steps may be performed, as necessary to fill the gap. One skilled in the art would know that any number of deposition and ALR etch steps may be performed before or after an HDP plasma etch step is used.

In some embodiments, the etch operations may occur in different chambers from the deposition operations. An advantage of the present invention is the ability to complete all deposition and etch operations in the same semiconductor tool and use the same vacuum environment for all operations, but it is not required. A first fill material may be deposited using a first deposition tool (e.g. HDPCVD), the etch process may be performed on an independent etch tool, and then a second fill material may be deposited using an HDPCVD chamber on a second deposition tool.

When the remaining gap attains a geometry which may be filled by one deposition, then a fill material is deposited to fill the gap. (See operation 417). The process parameters for the final deposition may be similar to those of the interim depositions.

Apparatus

Figure 6:
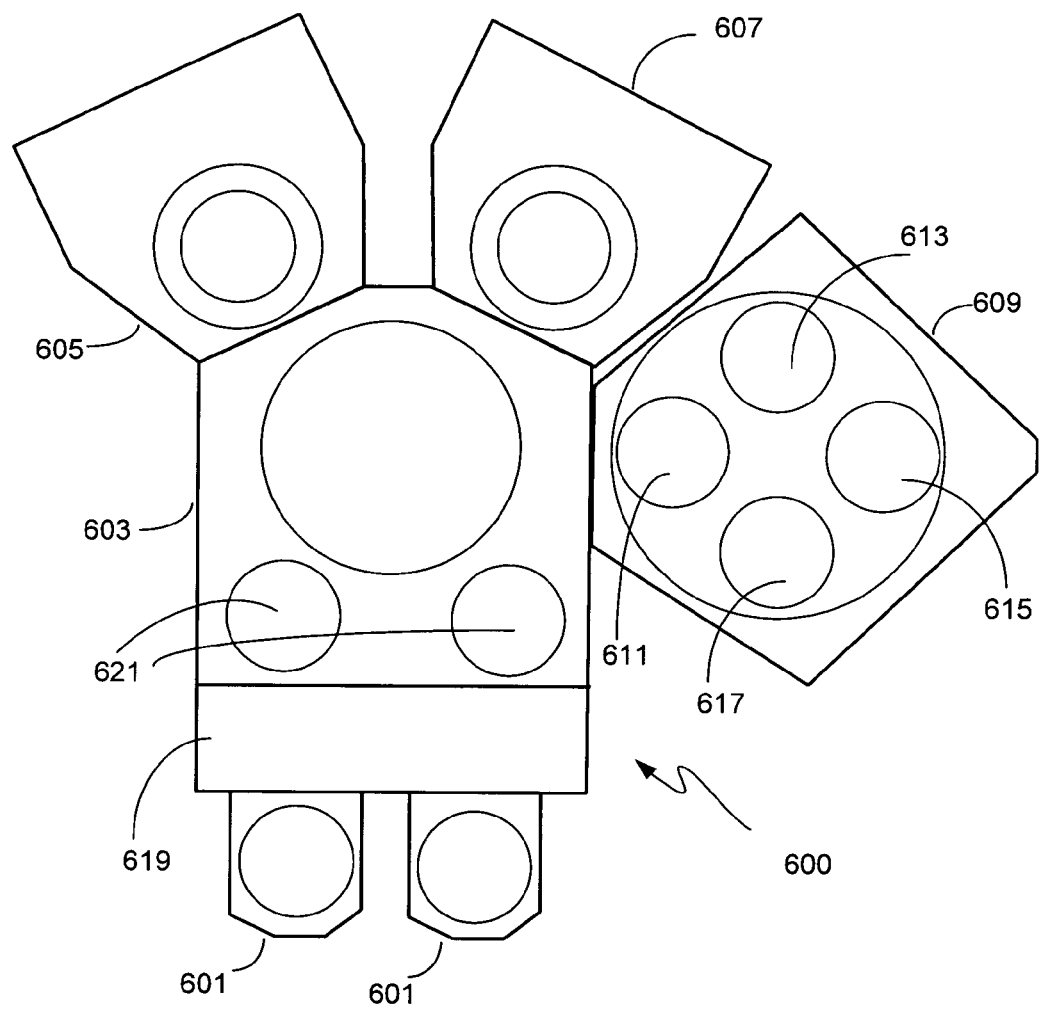
FIG. 6 is a block diagram of a plasma processing system suitable for conducting a multi-step gap fill process in accordance with the present invention.

In one embodiment, a single semiconductor processing tool may be configured to perform every operation of the method embodiment of the STI application of the present invention. FIG. 6 shows an example of a semiconductor processing tool 600 with two HDPCVD chambers 605/607 and a multi-station chamber 609 capable of performing the operations of the ALR etch method embodiment.

Partially fabricated semiconductor substrates would enter the system 600 from cassettes at 601, or front-opening unified pods (FOUPs). The substrates are individually removed from the FOUP into the atmospheric chamber 619 by an atmospheric robot (not shown) to one of two load locks 621. After the load lock pressure is pumped down to close to that of the transfer chamber 603, a transfer chamber robot (not shown) transfers the substrate to the first process chamber module, 605 or 607. Each process chamber module may be capable or be configured to deposit the protective liner, the fill material and/or etch the fill material using HDP plasma etch (optional). In some embodiments, the chamber module may be dedicated to either the protective liner formation or the fill material deposition operation. In one embodiment, the substrate enters chamber 605 to form a protective liner by depositing silicon nitride by HDPCVD, then transfers to chamber 607 to deposit a fill material, such as silicon oxide, by HDPCVD. In other embodiments, the operations are performed sequentially in the same chamber (605 or 607) by changing process gas and flow rate, chamber pressure, source RF power, bias power, and substrate pedestal temperature.

The ALR etch operations may be performed in a multi-station chamber such as chamber 609 of FIG. 6. The ALR etch module 609 may have two or more stations. As depicted, the module has 4 stations. Each station may perform the same operation or different operations. In one embodiment, the station 1 (611) delivers the ALR reactants to cause the reaction in the condensation regime to form a solid reaction product. Station 2 (613) removes the solid reaction product by decomposing, or subliming, the solid and removing the by-product gases. Station 3 (615) may repeat the reactant exposure to cause further etching reaction, but in the adsorption regime. Station 4 (617) could then remove the additional solid reaction product. In this configuration, more unwanted material from the top of the substrate and the sidewalls may be removed.

In another configuration, two of the stations (e.g. 611 and 613) may be used to control (cool) the temperature of the substrate after HDPCVD deposition, using a controlled temperature pedestal or other heating/cooling sources. Station 3 (615) delivers the ALR reactants to cause a reaction in the condensation regime to form a solid reaction product. Station 4 (617) removes the solid reaction product by subliming, or decomposing, the solid and removing the by-product gases. The substrate may then be subsequently cooled Stations 1 and 2 (611 and 613). Station 3 (615) may repeat the reactant exposure to cause further etching reaction, but in the adsorption regime. Station 4 (617) could then remove the additional solid reaction product. In this scenario, a substrate may pass each station twice before exiting the chamber.

The individual stations in multi-station chamber 609 may be micro-volume stations. A micro-volume station may have a volume less than 1 liter, preferably less than 500 milliliters. Using a micro-volume station reduces the amount of reactants used and saves material costs. The individual stations may also have a clam-shell configuration such that the interior volume of the station may be isolated from that of the greater chamber 609, which allows different process pressures in each station. The individual stations may be separated by a gas curtain instead of physical barriers. Of course, other configurations to isolate the interior volume of the station may be used, as well as configurations where the stations are not isolated and where different reactant partial pressures are controlled by station specific flowrates through the showerhead.

After the ALR etch operations in chamber 609, if no further deposition and etching is required, then the substrate is returned to loadlocks 621 for cool down before exiting the tool 600 via FOUPs 601. Alternatively, loadlocks 621 may be used for cooldown after the HDPCVD deposition operation. However, in most embodiments, after the ALR etch operations in chamber 609, the substrate is transferred to one of the HDPCVD chambers 605/607 for another fill material deposition. Although the use of HDPCVD chambers is envisioned, other types of chambers may be used. Other chamber types may include a single station chamber or a multi-station chamber for PECVD, SACVD, ALD, or PDL, or chambers for conducting a flowable silicon oxide process.

In certain embodiments, the semiconductor processing tool may not include the HDPCVD chambers 605/607 from FIG. 6. The tool may include one or more of the multi-station chambers such as the one depicted as 609 in FIG. 6. If more than one multi-station chamber is included, both chambers can perform the same 2-step ALR etch operation in parallel to increase the throughput of the etch operation. A substrate may enter such system with or without a protective liner and a first fill material already deposited. ALR etch process may be performed in the multi-station chamber as described above. The substrate may then be transferred to another processing tool.

In another embodiment, the semiconductor processing tool may have several single station chambers each dedicated to one operation or configured to perform all of the operations in sequence. For example, chamber 609 may be a single-station chamber that can be configured to perform the entire 2-step ALR etch operations: react with the fill material in the condensation regime (407), desorb the reaction product (409), react selectively with the remaining fill oxide material, without substantially removing the nitride material, in the adsorption regime (411), and desorb the reaction product (413). Also, more than one chamber 609 may be configured on the tool. In a further embodiment, the ALR etch chamber 609 may be on a tool that does not have any deposition chambers.

The apparatus may also include a controller configured to execute a set of instructions. The set of instructions may be instructions to expose the workpiece to an etchant under conditions that thermodynamically favor condensation of the etchant onto the feature; allow the etchant to etch fill material from said feature; expose the workpiece to the etchant under conditions that thermodynamically favor adsorption but not condensation of the etchant onto the feature; and, allow the adsorbed etchant to selectively etch fill material from the feature without substantially etching the protective nitride liner. The set of instructions may also include instructions to form a protective liner before the first fill material deposition step. The set of instructions may also include instructions to perform typical HDPCVD deposition/etch steps. These instructions are to perform the operations in the method embodiment of the present invention using various chambers of the apparatus for different operations.

A suitable semiconductor processing tool may b a C3 SPEED™ configured with one or more HDPCVD chambers and an ALR etch module, available from Novellus Systems, Inc. of San Jose, Calif. Other suitable semiconductor processing tool may include an Endura™ configured with one or more Siconi™ Preclean chambers, a Centura™ configured with one or more Ultima™ chambers and other chambers, or a Producer™ configured with dual-Siconi™ Preclean chambers and one or more SACVD oxide chambers, available from Applied Materials, Inc. of Santa Clara, Calif. In still other embodiments, more than one semiconductor processing tool may be used to perform the operations of the method embodiment. For example, either the liner deposition or the ALR selective etch may be formed in a different tool such as the VECTOR or SEQUEL tool available from Novellus Systems, Inc.

Pre-Silicide Clean Applications

Figure 7:
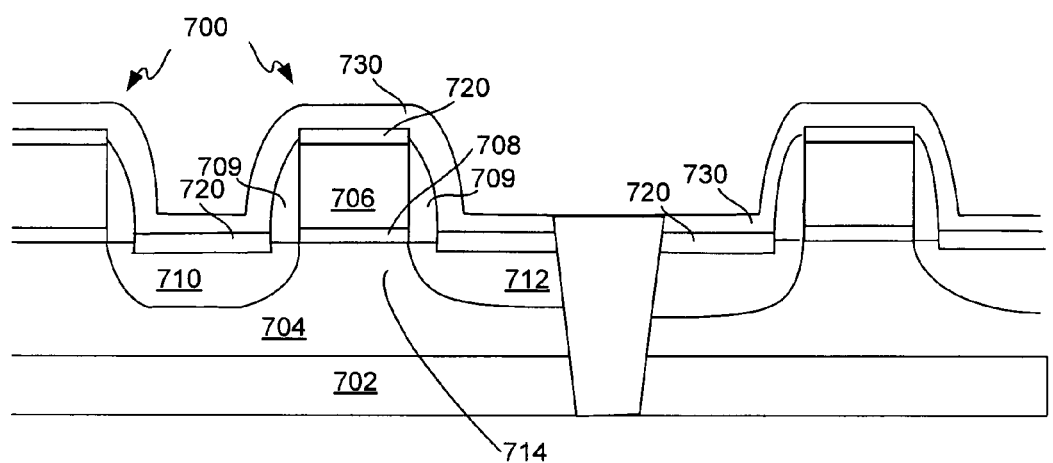
FIG. 7 is a schematic of a transistor that may be fabricated using an embodiment of the present invention.

Another application of the present invention is pre-silicide cleaning as part of transistor formation. FIG. 7 illustrates simple transistors in accordance with one embodiment of the present invention. The NMOS transistor 700 is composed of a p-doped substrate 702, an n-doped well 704 within the substrate 702, a conductive gate 706 separated from the n-well 704 of the substrate 702 by a gate dielectric 708 and n-doped source 710 and drain 712 regions on the well 704 on either side of the gate 706, and a channel 714 region underlying the gate 706. There may be sidewall spacers 709 on the gate 706. Sidewall spacers are typically silicon nitride, which may be deposited with LPCVD. These spacers isolate the gate and the silicon junctions. After the sidewall spacers are deposited, the source 710 and drain 712 regions and the gate 706 are covered with a layer of self-aligned silicide (salicide) 720. However, before the silicide, e.g., NiSi, can be deposited, the doped silicon and gate surfaces must be cleaned.

The clean process removes all native $SiO_2$ on the surface so that the silicide deposited can make a proper ohmic contact with the active surfaces. This cleaning process preferably does not reduce the LPCVD silicon nitride sidewall spacers and reduce the isolation between the gate and the silicon junctions. Thus a process with high etch selectivity for the native oxide over the silicon nitride must be used to clean pre-silicided surface. This high etch selectivity process may be ALR etch in the adsorption regime. Etch selectivities for the thermal oxide of the LPCVD silicon nitride may be at least about 50:1, at least about 100:1, or about 200:1.

The native oxide on the pre-silicided surface has an etch selectivity comparable to the thermal oxide and may be a range of thickness from about 5 angstrom to about 50 angstroms, mostly at about 20 angstroms. In the example where the native oxide may be at the thickest part 20 angstroms, etching at a regime where the silicon nitride etch selectivity is about 100:1 would etch 0.2 angstroms of silicon nitride, which is within acceptable thickness reduction range. Even if the process were set to over-etch the native oxide by two-fold, as is often the case to ensure that all native oxide is removed, only about 0.4 angstroms of silicon nitride spacer would be removed. After the etch is completed, the silicide 720, e.g., NiSi, may be deposited on the gate, source, and drain regions of the transistor. A capping layer 730 may also be deposited over the silicide to protect the transistor.

Depending on the thickness of sidewall spacer and the requirements of the device being manufactured, one skilled in the art would be able to select a process pressure at which an acceptable quantity of sidewall spacer may be etched while ensuring that all native oxide is removed from the pre-silicide surface. In some embodiments, the process pressure selection may be performed by a controller configured to determine the process pressure based on some input. The input may be an indication from the operator or a fab controlling software that this application requires a high etch selectivity process or input from the operator as to the etch selectivity required. The controller may include logic or data that would map an etch selectivity and material to the process pressure required. The controller would then expose the substrate or the workpiece to the etchant under conditions that would etch the materials selectively as required. In the high selectivity regime, such process condition may be conditions that thermodynamically favor adsorption but not condensation of the etchant. Under such process conditions, the etchant would selectively etch the oxide, which may include thermal oxide and deposited oxide in addition to native oxide, without substantially etching the nitride.

Contact Preclean Applications

The ALR pre-clean of interconnects may involve removal of silicon oxide from silicon, active silicon, polysilicon, and silicide contacts. Silicide contacts comprise metal silicides, such as nickel and cobalt silicides, ternary silicides, such as platinum nickel silicides and other silicide materials, commonly used in interconnects. Active silicon contacts refer to electrically active contacts typically formed with electrically active doped silicon material, and may be distinguished from electrically inactive silicon contacts, such as those used in mechanical structures on MEMS devices. The methods of present invention can be used for removal of material from both electrically active and electrically inactive silicon contacts. Atomic layer removal pre-clean methods may also be employed for removal of germanium and silicon oxides from germanium and silicon germanium contacts.

Figure 8A:
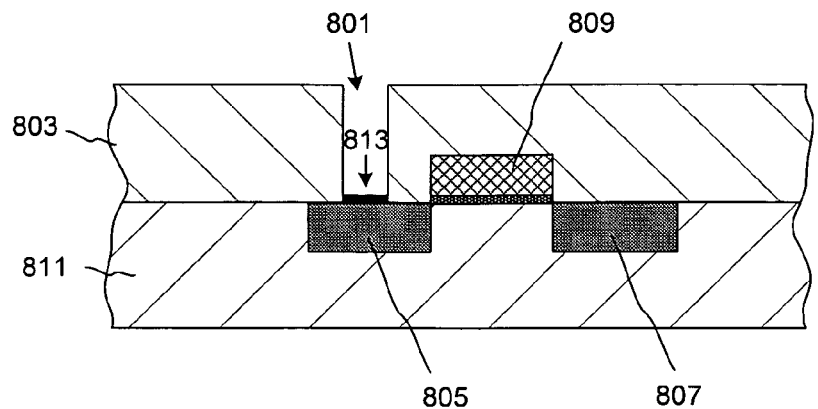
FIGS. 8A-8C show cross sectional depictions of device structures created by pre-clean and deposition steps during interconnect fabrication.
Figure 8B:
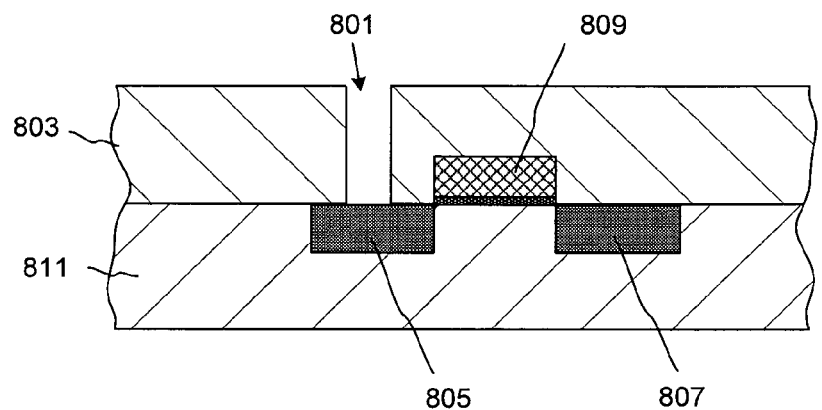
Figure 8C:
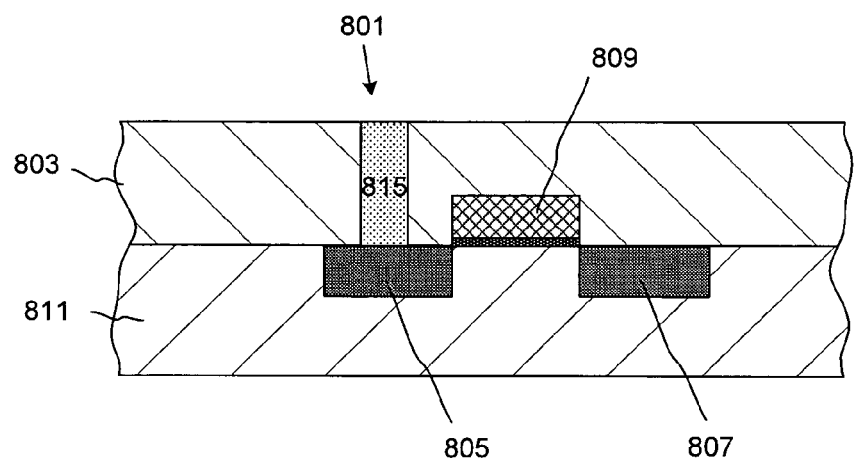

A typical interconnect which can be subjected to atomic layer removal pre-clean step is shown in FIG. 8A. In this case a via 801 is landed into silicon containing transistor source 805. Other interconnect configurations, such as a via landed into the silicon containing drain, or into the polysilicon containing gate may also be envisioned but are not shown for clarity reasons. The term "via" in the context of present invention is intended to include so called "contact holes" for connecting the first metallization layer with the base silicon layer as well as the vertical interconnects between adjacent metallization layers, which are conventionally referred to as vias. As was described in the background section, the bottom of the via 801 is covered with native oxide 813 as well as other oxide residues in some cases, which are removed during pre-clean step resulting in a structure shown in FIG. 8B. The cleaned via can now undergo further processing such as titanium and titanium nitride deposition, or tungsten nitride barrier deposition, and finally end with tungsten CVD fill deposition, which leads to the structure shown in FIG. 8C.

For contact preclean applications, there are cases where LPCVD $Si_3N_4$ is used at the bottom of the contact as the etch stop for contact materials as well as the liner on the contact side walls. The reactive ion etch (RIE) process used to etch the contact via may leave some remnants of LPCVD $Si_3N_4$ behind after the contact etch. The remaining $Si_3N_4$ residue, in addition to native $SiO_2$, must be removed by the contact preclean process so that a good electrical connection can be made. Under this circumstance, the desirable etch selectivity of $Si_3N_4$ is should be much lower than that needed in STI and pre-silicide applications and preferably to be as low as possible. In other words, the ALR contact etch process should etch as much LPCVD silicon nitride as possible relative to the native silicon oxide.

Depending on the thickness of the native oxide and remnant silicon nitride to be removed, one skilled in the art would be able to select a process pressure for an acceptable ALR etch selectivity. In order to achieve a low ALR etch selectivity, the contact via preclean is preferably conducted in the condensation regime. According to FIG. 2, the etch selectivity is very high in the adsorption regime and decreases as the process pressure crosses the threshold pressure and has a minimum at about 10 mTorr. Between 10 and 13 mTorr, the etch selectivity appears to change little, perhaps rising slightly. One skilled in the art would be able to collect data to find the minimum etch selectivity under various reactor conditions to ensure that all of the remnant LPCVD silicon nitride is removed during contact preclean.

In some embodiments, the process pressure selection may be performed by a controller configured to determine the process pressure based on some input. The input may be an indication from the operator or a fab controlling software that this application requires a low etch selectivity process or input from the operator as to the etch selectivity required. The controller may include logic or data that would map an etch selectivity and material to the process pressure required. The controller would then expose the substrate or the workpiece to the etchant under conditions that would etch the materials selectively as required. In the low selectivity regime, such process condition may be conditions that thermodynamically favor condensation of the etchant. Under such process conditions, the etchant would etch the oxide, which may include thermal oxide and deposited oxide in addition to native oxide, as well as etching the nitride.

CONCLUSION

For the above three applications, etching of silicon oxide can be achieved by HF—$NH_3$ gas based etching. For applications such as STI etch and pre-silicide clean, which require high silicon nitride selectivity, etching should be performed in the adsorption regime or first in the condensation regime followed by the adsorption regime. Conversely for applications such as contact preclean which requires high silicon nitride etch rate to remove the incompletely etched LPCVD silicon nitride remnant from contact RIE process, etching should be performed in the condensation regime, e.g., at or greater than about 10 mTorr. The present invention is not limited to the above three applications.

The present invention may be used in any ALR type etching applications where different materials are present or may be etched. Other ALR type etching applications may be referred to as chemical oxide removal (COR™) or Siconi™ pre-clean. Selection of a process pressure may depend not only on the etch selectivity of one material, e.g., LPCVD silicon nitride, but also the second material if it is not thermal oxide or a silicon oxide that etches similarly to thermal oxide. For example, a situation may arise where zirconium oxide and silicon nitride are both present on the surface of the workpiece to be etched. The relative etch rates of the zirconium oxide and silicon nitride, that is, the ratio of their etch selectivities, would determine the optimal process pressure at which to conduct the etch. One skilled in the art would be able to exploit the etch rate responses in different etchant pressure regimes to collect etch rate and etch selectivity rate for all materials that may be etched using the ALR process and compile charts that map a desired etch selectivity ratio between two materials and the process pressure using the principles disclosed herein.

Although the experiment for collecting the supporting data for this invention was performed with gaseous HF and $NH_3$, this invention is independent of HF source and $NH_3$ source. For example, HF can be synthesized by flowing fluorine-containing chemicals into plasma to produce atomic or molecular fluorine species, and let them react with hydrogen to form HF, or flow both fluorine-containing chemicals and hydrogen into plasma to form HF, or even flow fluorine-containing chemicals and $NH_3$ into plasma to form ammonia fluoride or ammonia bifluoride.

What is claimed is:

1. A method comprising:
   (a) depositing an etchant on a feature of a surface of a work piece under conditions that thermodynamically provide for condensation of the etchant, wherein an oxide and a liner are on the feature;
   (b) etching the oxide on the feature;
   (c) depositing the etchant on the feature under conditions that thermodynamically provide for adsorption of the etchant; and
   (d) selectively etching the oxide on the feature without substantially etching the liner.

2. The method of claim 1, wherein the liner is silicon nitride deposited via a process selected from the group consisting of low-pressure chemical vapor deposition, plasma enhanced chemical vapor deposition, atomic layer deposition, and high density plasma chemical vapor deposition.

3. The method of claim 1, wherein the oxide is selected from the group consisting of thermal silicon oxide, flowable silicon oxide, silicon oxide deposited via plasma enhanced chemical vapor deposition, silicon oxide deposited via sub-atmospheric chemical vapor deposition, silicon oxide deposited via atomic layer deposition, silicon oxide deposited via pulsed deposition layer processing, and silicon oxide deposited via high density plasma chemical vapor deposition.

4. The method of claim 1, wherein the oxide is hafnium oxide or zirconium oxide.

5. The method of claim 1, wherein operations (a) to (d) are performed in a single chamber.

6. The method of claim 5, wherein the chamber comprises at least two processing stations, and wherein operations (a) and (c) are performed in different processing stations.

7. The method of claim 1, wherein the conditions that thermodynamically provide for condensation of the etchant are conditions in which a partial pressure of the etchant in a chamber housing the work piece is greater than a vapor pressure of the etchant.

8. The method of claim 7, wherein the partial pressure during (a) is between about 10 and 15 mTorr, and wherein the etchant is selected from the group consisting of ammonium fluoride, ammonium bifluoride, and ammonium fluoride and ammonium bifluoride.

9. The method of claim 7, wherein the partial pressure during (a) is between about 10 and 13 mTorr, and wherein the etchant is selected from the group consisting of ammonium fluoride, ammonium bifluoride, and ammonium fluoride and ammonium bifluoride.

10. The method of claim 1, wherein the conditions that thermodynamically provide for adsorption of the etchant are conditions in which a vapor pressure of the etchant is greater than a partial pressure of the etchant in a chamber housing the work piece.

11. The method of claim 10, wherein the partial pressure during (c) is between about 1 and 10 mTorr, and wherein the etchant is selected from the group consisting of ammonium fluoride, ammonium bifluoride, and ammonium fluoride and ammonium bifluoride.

12. The method of claim 10, wherein the partial pressure during (c) is between about 5 and 8 mTorr, and wherein the etchant is selected from the group consisting of ammonium fluoride, ammonium bifluoride, and ammonium fluoride and ammonium bifluoride.

13. The method of claim 1, wherein the work piece temperature is about 0 to 50° C. during operations (a) to (d).

14. The method of claim 1, wherein the work piece temperature is about 25° C. during operations (a) to (d).

15. The method of claim 1, wherein (a) and/or (c) comprise concurrently introducing a hydrogen-containing species and a fluorine-containing species into a chamber housing the work piece.

16. The method of claim 1, wherein (a) and/or (c) comprise sequentially introducing a hydrogen-containing species and a fluorine-containing species into a chamber housing the work piece.

17. The method of claim 1, wherein (a) and/or (c) comprise introducing ammonia and hydrogen fluoride into a chamber housing the work piece.

18. The method of claim 1, wherein (a) and/or (c) comprise introducing ammonia and nitrogen trifluoride into a chamber housing the work piece.

19. The method of claim 1, wherein the feature is a trench partially filled with the oxide.

20. A method comprising:
   (a) condensing a layer of an ammonium halide etchant on a feature of a surface of a work piece, wherein an oxide and a nitride are on the feature;
   (b) etching the oxide on the feature;
   (c) depositing a partially saturated layer of the ammonium halide etchant on the feature of the surface of the work piece under conditions that thermodynamically provide for deposition of the partially saturated layer; and
   (d) selectively etching the oxide on the feature without substantially etching the nitride, wherein an etch selectivity for the oxide over the nitride is at least about 50:1.

21. The method of claim 20, wherein the etch selectivity is at least about 100:1.

22. The method of claim 20, wherein the etch selectivity is at least about 200:1.

23. The method of claim 20, wherein the nitride is silicon nitride deposited via a process selected from the group consisting of low-pressure chemical vapor deposition, plasma enhanced chemical vapor deposition, atomic layer deposition, and high density plasma chemical vapor deposition.

24. The method of claim 20, wherein the oxide is selected from the group consisting of thermal silicon oxide, flowable silicon oxide, silicon oxide deposited via plasma enhanced chemical vapor deposition, silicon oxide deposited via sub-atmospheric chemical vapor deposition, silicon oxide deposited via atomic layer deposition, silicon oxide deposited via pulsed deposition layer processing, and silicon oxide deposited via high density plasma chemical vapor deposition.

25. A method comprising:
(a) depositing an etchant on a feature of a surface of a work piece under conditions that thermodynamically provide for condensation of the etchant, wherein an oxide and a liner are on the feature;
(b) etching the oxide on the feature with the etchant deposited under conditions that thermodynamically provide for condensation of the etchant;
(c) removing the etchant from the feature to stop the etching of the oxide on the feature with the etchant deposited under conditions that thermodynamically provide for condensation of the etchant;
(d) removing solid reaction product from the etching of the oxide on the feature with the etchant deposited under conditions that thermodynamically provide for condensation of the etchant;
(e) depositing the etchant on the feature under conditions that thermodynamically provide for adsorption of the etchant; and
(f) selectively etching the oxide on the feature with the etchant deposited under conditions that thermodynamically provide for adsorption of the etchant without substantially etching the liner.

26. A method comprising:
(a) depositing an etchant on a feature of a surface of a work piece under conditions that thermodynamically provide for condensation of the etchant, wherein an oxide and a liner are on the feature;
(b) etching the oxide on the feature with the etchant deposited under conditions that thermodynamically provide for condensation of the etchant;
(c) removing the etchant from the feature to stop the etching of the oxide on the feature with the etchant deposited under conditions that thermodynamically provide for condensation of the etchant;
(d) depositing the etchant on the feature under conditions that thermodynamically provide for adsorption of the etchant; and
(e) selectively etching the oxide on the feature with the etchant deposited under conditions that thermodynamically provide for adsorption of the etchant without substantially etching the liner.

* * * * *